United States Patent
Liu et al.

(10) Patent No.: US 12,172,188 B2
(45) Date of Patent: Dec. 24, 2024

(54) MICROMACHINED ULTRASOUND TRANSDUCER WITH PEDESTAL

(71) Applicant: BFLY OPERATIONS, INC., Burlington, MA (US)

(72) Inventors: Jianwei Liu, Fremont, CA (US); Lingyun Miao, Fremont, CA (US); Victor L. Pushparaj, Milpitas, CA (US); Nikhil Apte, San Jose, CA (US)

(73) Assignee: BFLY OPERATIONS, INC., Burlington, MA (US)

( * ) Notice: Subject to any disclaimer, the term of this patent is extended or adjusted under 35 U.S.C. 154(b) by 279 days.

(21) Appl. No.: 17/685,991

(22) Filed: Mar. 3, 2022

(65) Prior Publication Data
US 2022/0280972 A1    Sep. 8, 2022

Related U.S. Application Data

(60) Provisional application No. 63/156,885, filed on Mar. 4, 2021.

(51) Int. Cl.
*B06B 1/02*    (2006.01)
*B81B 3/00*    (2006.01)

(52) U.S. Cl.
CPC .......... *B06B 1/0292* (2013.01); *B81B 3/0021* (2013.01); *B06B 2201/40* (2013.01)

(58) Field of Classification Search
None
See application file for complete search history.

(56) References Cited

U.S. PATENT DOCUMENTS

| | | | |
|---|---|---|---|
| 5,619,476 A | 4/1997 | Haller et al. | |
| 5,894,452 A | 4/1999 | Ladabaum et al. | |
| 5,982,709 A | 11/1999 | Ladabaum et al. | |
| 6,004,832 A | 12/1999 | Haller et al. | |
| 6,262,946 B1 | 7/2001 | Khuri-Yakub et al. | |
| 6,430,109 B1 | 8/2002 | Khuri-Yakub et al. | |
| 6,571,445 B2 * | 6/2003 | Ladabaum ............ | B06B 1/0292 29/609.1 |
| 6,836,020 B2 | 12/2004 | Cheng et al. | |
| 6,958,255 B2 | 10/2005 | Khuri et al. | |
| 7,274,623 B2 | 9/2007 | Bayram et al. | |

(Continued)

FOREIGN PATENT DOCUMENTS

| CN | 101977026 A | 2/2011 |
|---|---|---|
| CN | 105307975 A | 2/2016 |

(Continued)

OTHER PUBLICATIONS

Extended European Search Report dated Jul. 11, 2022 in connection with European Application No. 19884050.6.

(Continued)

*Primary Examiner* — Isam A Alsomiri
*Assistant Examiner* — Jonathan D Armstrong
(74) *Attorney, Agent, or Firm* — Boston & Galway

(57) ABSTRACT

An ultrasonic transducer is described. The ultrasonic transducer comprises a membrane and a substrate disposed opposite the membrane such that a cavity is formed therebetween. The substrate comprises an electrode region and pedestals protruding from a surface of the substrate and having a height greater than a height of the electrode region, the pedestals being electrically isolated from the electrode region.

7 Claims, 18 Drawing Sheets

(56) References Cited

U.S. PATENT DOCUMENTS

| | | | |
|---|---|---|---|
| 7,321,181 B2 | 1/2008 | Khuri et al. | |
| 7,530,952 B2* | 5/2009 | Huang | B06B 1/0292 367/181 |
| 7,545,075 B2 | 6/2009 | Huang et al. | |
| 7,615,834 B2 | 11/2009 | Khuri-Yakub et al. | |
| 7,741,686 B2 | 6/2010 | Khuri et al. | |
| 7,745,248 B2 | 6/2010 | Park et al. | |
| 7,745,973 B2 | 6/2010 | Bayram et al. | |
| 7,846,102 B2 | 12/2010 | Kupnik et al. | |
| 7,972,271 B2 | 7/2011 | Johnson et al. | |
| 8,008,105 B2* | 8/2011 | Huang | B06B 1/0292 438/52 |
| 8,120,229 B2 | 2/2012 | Huang | |
| 8,276,433 B2 | 10/2012 | Kupnik et al. | |
| 8,402,831 B2 | 3/2013 | Kupnik et al. | |
| 8,451,693 B2 | 5/2013 | Nikoozadeh et al. | |
| 9,067,779 B1 | 6/2015 | Rothberg et al. | |
| 9,249,008 B2* | 2/2016 | Hsu | G01L 9/0073 |
| 9,499,392 B2 | 11/2016 | Rothberg et al. | |
| 9,505,030 B2 | 11/2016 | Rothberg et al. | |
| 9,533,873 B2 | 1/2017 | Rothberg et al. | |
| 10,512,936 B2 | 12/2019 | Alie et al. | |
| 10,525,506 B2 | 1/2020 | Alie et al. | |
| 10,856,840 B2 | 12/2020 | Rothberg et al. | |
| 10,856,844 B2 | 12/2020 | Liu et al. | |
| 10,939,214 B2* | 3/2021 | Kuntzman | H04R 7/12 |
| 11,018,068 B2 | 5/2021 | Fife et al. | |
| 11,389,137 B2 | 7/2022 | Fife et al. | |
| 11,617,042 B2* | 3/2023 | Kuntzman | H04R 19/04 381/174 |
| 2003/0220554 A1 | 11/2003 | Grenon et al. | |
| 2005/0228285 A1* | 10/2005 | Huang | B06B 1/0292 600/459 |
| 2006/0004289 A1 | 1/2006 | Tian et al. | |
| 2006/0075818 A1 | 4/2006 | Huang et al. | |
| 2007/0059858 A1 | 3/2007 | Caronti et al. | |
| 2007/0164632 A1 | 7/2007 | Adachi et al. | |
| 2007/0215964 A1 | 9/2007 | Khuri-Yakub et al. | |
| 2009/0122651 A1 | 5/2009 | Kupnik et al. | |
| 2009/0142872 A1 | 6/2009 | Park et al. | |
| 2010/0173437 A1* | 7/2010 | Wygant | B06B 1/0292 257/E21.214 |
| 2010/0202254 A1 | 8/2010 | Roest et al. | |
| 2010/0225200 A1 | 9/2010 | Kupnik et al. | |
| 2011/0050033 A1 | 3/2011 | Nikoozadeh et al. | |
| 2011/0055447 A1 | 3/2011 | Costa | |
| 2011/0241802 A1* | 10/2011 | Joshi | H01P 7/06 333/209 |
| 2012/0243095 A1 | 9/2012 | Sagberg et al. | |
| 2013/0087867 A1 | 4/2013 | Ho et al. | |
| 2013/0135971 A1 | 5/2013 | Nakanishi | |
| 2014/0217478 A1 | 8/2014 | Rothberg et al. | |
| 2014/0219062 A1 | 8/2014 | Rothberg et al. | |
| 2014/0265720 A1 | 9/2014 | El-Gamal et al. | |
| 2015/0145374 A1 | 5/2015 | Xu et al. | |
| 2015/0368097 A1 | 12/2015 | Behrendt et al. | |
| 2016/0009544 A1 | 1/2016 | Rothberg et al. | |
| 2016/0290970 A1 | 10/2016 | Rothberg et al. | |
| 2016/0318753 A1 | 11/2016 | Chou | |
| 2016/0337761 A1* | 11/2016 | Hall | G01S 3/801 |
| 2016/0379973 A1 | 12/2016 | Rothberg et al. | |
| 2018/0243792 A1 | 8/2018 | Rothberg et al. | |
| 2019/0055117 A1 | 2/2019 | Steiert | |
| 2019/0231312 A1 | 8/2019 | Fife et al. | |
| 2019/0275561 A1 | 9/2019 | Fife et al. | |
| 2019/0336099 A1 | 11/2019 | Fife et al. | |
| 2019/0336103 A1 | 11/2019 | Fife et al. | |
| 2019/0336104 A1 | 11/2019 | Fife et al. | |
| 2020/0013691 A1 | 1/2020 | Liu et al. | |
| 2020/0102214 A1 | 4/2020 | Liu et al. | |
| 2020/0147641 A1 | 5/2020 | Fife et al. | |
| 2020/0156110 A1 | 5/2020 | Miao et al. | |
| 2020/0156111 A1* | 5/2020 | Gross | B81B 3/0086 |
| 2020/0184176 A1 | 6/2020 | Liu et al. | |
| 2020/0184177 A1 | 6/2020 | Liu et al. | |
| 2020/0239299 A1 | 7/2020 | Liu et al. | |
| 2020/0254487 A1 | 8/2020 | Miao et al. | |
| 2020/0269279 A1 | 8/2020 | Miao et al. | |
| 2020/0324318 A1 | 10/2020 | Liu et al. | |
| 2020/0324319 A1 | 10/2020 | Miao et al. | |
| 2020/0348794 A1 | 11/2020 | Ralston et al. | |
| 2020/0349342 A1 | 11/2020 | Ralston et al. | |
| 2020/0407220 A1 | 12/2020 | Lin et al. | |
| 2021/0038193 A1 | 2/2021 | Liu et al. | |
| 2021/0183832 A1 | 6/2021 | Chen et al. | |
| 2021/0285917 A1 | 9/2021 | Liu et al. | |
| 2021/0361260 A1 | 11/2021 | Miao et al. | |
| 2021/0403321 A1 | 12/2021 | Liu et al. | |
| 2021/0404994 A1 | 12/2021 | Pushparaj et al. | |
| 2022/0283121 A1* | 9/2022 | Miao | G01N 29/2406 |
| 2023/0278073 A1* | 9/2023 | Lien | B06B 1/0292 310/309 |

FOREIGN PATENT DOCUMENTS

| | | |
|---|---|---|
| CN | 109092650 A | 12/2018 |
| WO | 01/97562 A2 | 12/2001 |

OTHER PUBLICATIONS

International Search Report and Written Opinion mailed Jan. 29, 2020 in connection with International Application No. PCT/US2019/061403.

International Preliminary Report on Patentability mailed May 27, 2021 in connection with International Application No. PCT/US2019/061403.

Invitation to Pay Additional Fees mailed Jan. 13, 2020 in connection with International Application No. PCT/US2019/061419.

International Search Report and Written Opinion mailed Mar. 10, 2020 in connection with International Application No. PCT/US2019/061419.

International Preliminary Report on Patentability mailed Sep. 2, 2021 for International Application No. PCT/US2019/061419.

Invitation to Pay Additional Fees mailed Jul. 5, 2022 in connection with International Application No. PCT/US2022/018680.

International Search Report and Written Opinion mailed Sep. 6, 2022 in connection with International Application No. PCT/US2022/018680.

International Search Report and Written Opinion mailed Jun. 2, 2022 in connection with International Application No. PCT/US2022/018701.

Kupnik et al., Wafer-bonded CMUT meets CMOS MEMS-based Ultrasonic Transducer Arrays including Electronics Integration. CMOS Emerging Technology Workshop, Whistler, Canada. May 21, 2010; 22 pages.

Kupnik et al., CMUT Fabrication Based on a Thick Buried Oxide Layer. IEEE International Ultrasonics Symposium Oct. 11, 2010; pp. 547-550.

Khuri-Yakub et al., Miniaturized Ultrasound Imaging Probes Enabled by CMUT Arrays with Integrated Frontend Electronic Circuits. Annual International Conference of the IEEE Engineering in Medicine and Biology 2010, 13 pages.

Khuri-Yakub et al., Capacitive micromachined ultrasonic transducers for medical imaging and therapy. J. Micromech and Microeng. Apr. 28, 2011; 21(5):054004. 11 pages.

* cited by examiner

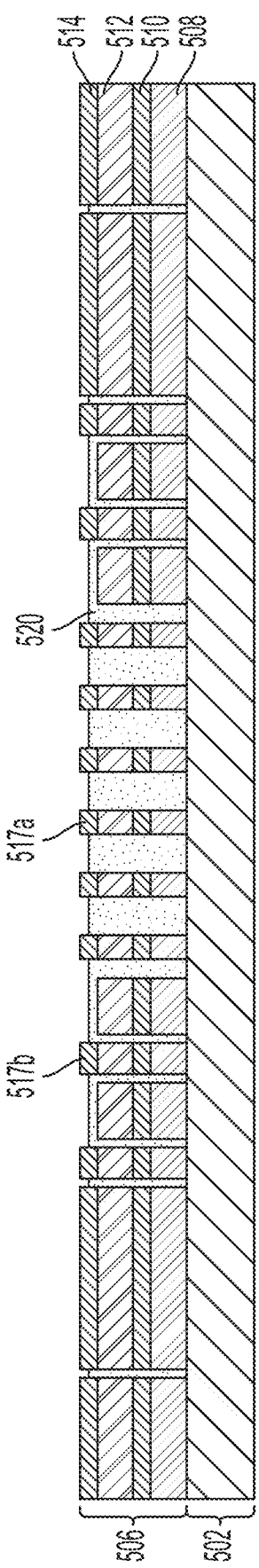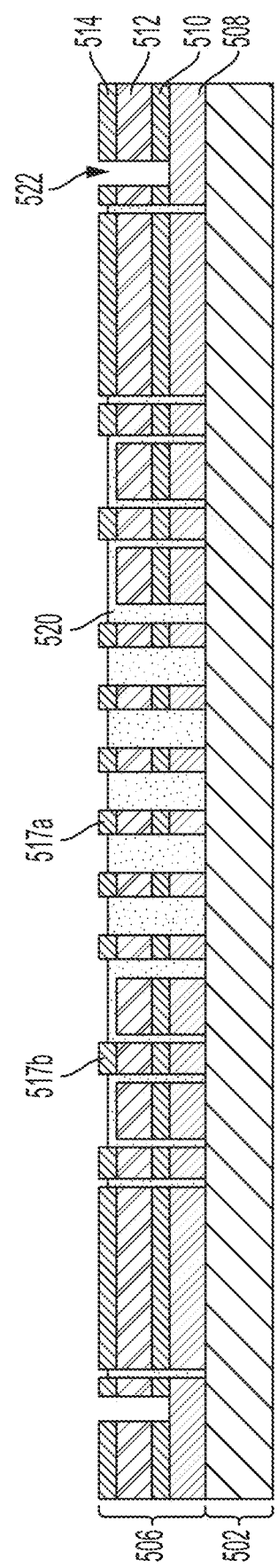

MICROMACHINED ULTRASOUND TRANSDUCER WITH PEDESTAL

CROSS-REFERENCE TO RELATED APPLICATIONS

The present application claims the benefit under 35 U.S.C. § 119(e) of U.S. Provisional Application Ser. No. 63/156,885, filed Mar. 4, 2021, under and entitled "MICROMACHINED ULTRASOUND TRANSDUCER WITH PEDESTAL," which is hereby incorporated by reference herein in its entirety.

FIELD

The present disclosure relates to capacitive micromachined ultrasonic transducers (CMUTs), and more specifically to CMUTs having pedestals.

BACKGROUND

Ultrasound devices may be used to perform diagnostic imaging and/or treatment, using sound waves with frequencies that are higher than those audible to humans. Ultrasound imaging may be used to see internal soft tissue body structures. When pulses of ultrasound are transmitted into tissue, sound waves of different amplitudes may be reflected back towards the probe at different tissue interfaces. These reflected sound waves may then be recorded and displayed as an image to the operator. The strength (amplitude) of the sound signal and the time it takes for the wave to travel through the body may provide information used to produce the ultrasound image. Many different types of images can be formed using ultrasound devices. For example, images can be generated that show two-dimensional cross-sections of tissue, blood flow, motion of tissue over time, the location of blood, the presence of specific molecules, the stiffness of tissue, or the anatomy of a three-dimensional region.

SUMMARY

Ultrasonic transducers having pedestals are described herein. In some embodiments, the ultrasonic transducers are capacitive micromachined ultrasonic transducers (CMUTs).

In some aspects, the techniques described herein relate to an ultrasound device, including: a substrate; a cavity bottom layer disposed on the substrate, the cavity bottom layer including: an inner region having a first radius, the inner region including a first plurality of pedestals protruding from a surface of the cavity bottom layer, wherein pedestals of the first plurality of pedestals include a first pedestal radius; a middle region having a first inner radius and a first outer radius, the first inner radius being approximately equal to the first radius and the first outer radius being greater than the first inner radius, the middle region including a second plurality of pedestals protruding from the surface of the cavity bottom layer, wherein pedestals of the second plurality of pedestals include a second pedestal radius greater than the first pedestal radius; an outer region surrounding the middle region and having a second inner radius and a second outer radius, the second inner radius being approximately equal to the first outer radius and the second outer radius being greater than the second inner radius; and an electrode layer disposed under the middle region and the outer region; and side walls extending from the cavity bottom layer; and a membrane disposed opposite the substrate and supported by the side walls to form a sealed cavity between the membrane and the substrate, wherein the pedestals of the first plurality of pedestals and the pedestals of the second plurality of pedestals are electrically isolated from the electrode layer.

In some embodiments, the pedestals of the first plurality of pedestals and the pedestals of the second plurality of pedestals include a dielectric material having a dielectric constant in range from 3.9 to 50.

In some embodiments, the dielectric material includes silicon dioxide ($SiO_2$), silicon nitride ($Si_3N_4$), or hafnium oxide ($HfO_2$).

In some embodiments, the pedestals of the first plurality of pedestals and the pedestals of the second plurality of pedestals are electrically isolated from the electrode layer by a trench.

In some embodiments, the trench includes an electrically insulating material having a resistivity in a range from $1 \times 10^{15}$ Ω·m to $1 \times 10^{25}$ Ω·m.

In some embodiments, the pedestals of the first plurality of pedestals have a first pitch and pedestals of the second plurality of pedestals have a second pitch greater than the first pitch.

In some embodiments, the electrode layer includes a plurality of layers including a titanium nitride (TiN) layer and a titanium (Ti) layer.

In some aspects, the techniques described herein relate to an ultrasonic transducer, including: a membrane; and a substrate disposed opposite the membrane such that a cavity is formed therebetween; and a cavity bottom layer disposed on the substrate, the cavity bottom layer including: an electrode region; and pedestals protruding from a surface of the substrate and having a height greater than a height of a surface of the electrode region, the pedestals being electrically isolated from the electrode region, wherein the pedestals include a dielectric material having a dielectric constant in a range from 3.9 to 50.

In some embodiments, the pedestals include between 50 and 500 pedestals.

In some embodiments, the dielectric material includes silicon dioxide ($SiO_2$), silicon nitride ($Si_3N_4$), or hafnium oxide ($HfO_2$).

In some embodiments, the pedestals are electrically isolated from the electrode region by a trench.

In some embodiments, the trench includes an electrically insulating material having a resistivity in a range from $1 \times 10^{15}$ Ω·m to $1 \times 10^{25}$ Ω·m.

In some embodiments, the pedestals include a first plurality of pedestals and a second plurality of pedestals, the first plurality of pedestals have a first pitch, and the second plurality of pedestals have a second pitch greater than the first pitch.

In some embodiments, the pedestals include a first plurality of pedestals and a second plurality of pedestals, the first plurality of pedestals have a first diameter, and the second plurality of pedestals have a second diameter greater than the first diameter.

In some embodiments, the electrode layer includes a plurality of layers including a titanium nitride (TiN) and a titanium (Ti) layer.

In some aspects, the techniques described herein relate to a method of forming an ultrasound device, including: forming a capacitive micromachined ultrasonic transducer (CMUT) by: forming an electrode layer on a substrate; forming a dielectric layer over the electrode layer; forming trenches in the dielectric and electrode layers to form pedestals that are electrically isolated from the electrode layer in a sensing region; and forming an oxide layer to fill the trenches to a first height such that a second height of the pedestals is greater than the first height; and forming a membrane over the CMUT substrate such that a cavity exists between the pedestals of the CMUT substrate and the membrane.

In some embodiments, forming the dielectric layer includes forming a dielectric layer having a dielectric constant in a range from 3.9 to 50.

In some embodiments, forming the dielectric layer includes forming a dielectric layer including one of silicon dioxide ($SiO_2$), silicon nitride ($Si_3N_4$), or hafnium oxide ($HfO_2$).

In some embodiments, forming the trenches includes forming between 50 and 500 electrically isolated pedestals.

In some embodiments, forming the electrode layer includes forming a plurality of layers including a titanium nitride (TiN) and a titanium (Ti) layer.

BRIEF DESCRIPTION OF THE DRAWINGS

The following brief description of the drawings is meant to assist the understanding of one skilled in the art and is not meant to unduly limit any present or future claims relating to the present disclosure. Various aspects and embodiments are described with reference to the following exemplary and non-limiting figures. It should be appreciated by one skilled in the art that the figures are not necessarily drawn to scale. Items appearing in multiple figures are indicated by the same or a similar reference number in all the figures in which they appear.

FIGS. 5A-5J illustrate cross-sectional views of a CMUT during a fabrication sequence for forming electrically isolated pedestals in the substrate of the CMUT in accordance with certain embodiments of the present disclosure.

DETAILED DESCRIPTION

Figure 1:
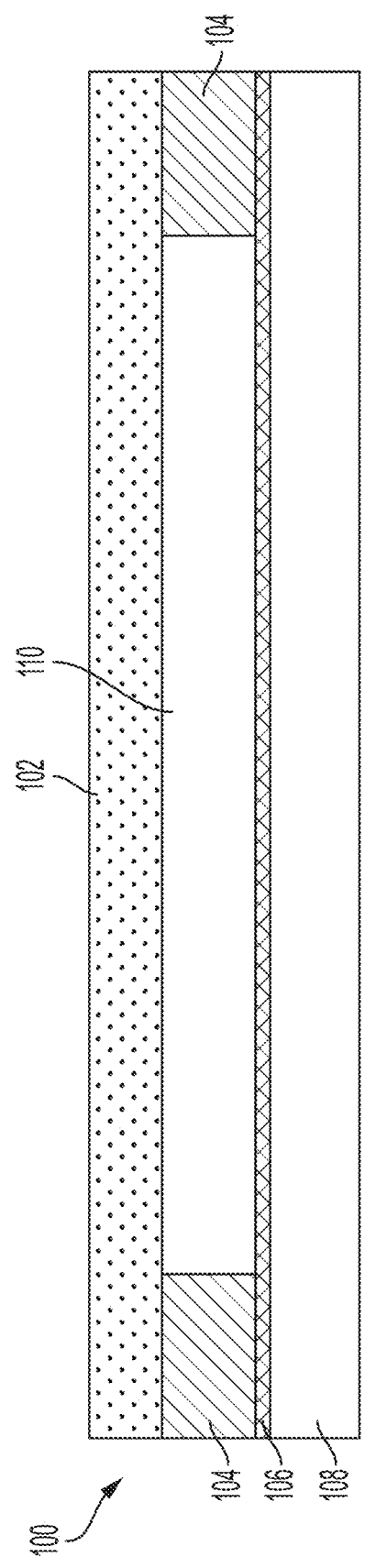
FIG. 1 illustrates a side cross-sectional view of a capacitive micromachined ultrasonic transducer (CMUT) in a non-collapsed position.

Capacitive micromachined ultrasonic transducers (CMUTs) may include a membrane, a substrate, and a cavity in between. In operation, the membrane may vibrate up and down in response to a time-varying voltage applied across the cavity (i.e., between the membrane and the substrate), thus varying the cavity height. This vibration of the membrane may cause transmission of ultrasound waves. In addition, in response to reception of ultrasound waves, the membrane may vibrate up and down, thereby varying the cavity height and generating a time-varying voltage across the cavity between the membrane and the substrate, which can be detected. In some operating modes of transmission or reception of ultrasound waves, the CMUT membrane may move into a collapsed position in which the membrane contacts the bottom layer of the cavity. It may be desirable for the membrane to return to a non-collapsed position after transmission or reception of ultrasound waves. However, due to various mechanisms such as surface charging or surface energy, the membrane may remain stuck to the cavity bottom layer, a phenomenon that may be referred to as membrane stiction. Membrane stiction may be undesirable as it may result in the CMUT operating poorly or ceasing to operate.

Generally, pedestals protruding from the surface of the bottom layer of a cavity may be helpful in reducing membrane stiction due to reduction of the contact area between the membrane and the cavity bottom layer. That is, the total surface area of the pedestals may be less than the total surface area of a flat cavity bottom layer, so that by positioning the pedestals to contact the membrane the resulting contact area between the membrane and the cavity bottom layer is reduced compared to if the cavity bottom layer were flat. The inventors have recognized that such pedestals may improve operation and/or device reliability such as longevity of a CMUT.

In some embodiments, the pedestals may be uniform in nature. A CMUT may be said to have uniform pedestals where the pedestals share at least one characteristic that is the same across all of the pedestals. For example, the pedestals may have a same top surface area. As another example, the pedestals may be separated by a uniform pitch.

In some embodiments, the pedestals may be non-uniform across a bottom layer of the CMUT cavity. A CMUT may be said to have non-uniform pedestals where a subset (i.e., one or more, but fewer than all) of the pedestals has at least one characteristic that is different than another subset of the pedestals. For example, a subset of the pedestals may have a different top surface area than that of another subset of the pedestals. As another example, a subset of the pedestals may be separated from each other by a pitch that is different than that separating pedestals of another subset. In some embodiments, a CMUT may have one subset of pedestals that differs from another subset of pedestals of the CMUT in both the top surface area and the pitch separating the pedestals. The inventors have recognized that, in certain regions of a CMUT, pedestals having a certain characteristic may be helpful, while in other regions of a CMUT, pedestals having a different characteristic may be helpful. This may be because in certain regions of a CMUT, certain factors relevant to operation and/or device reliability of a CMUT, such as stiction, sensing sensitivity, and/or impact force, and/or electrical characteristics including effects of parasitic capacitance and/or electrical breakdown may be more important, and certain characteristics of pedestals may be more helpful in relation to those factors.

The inventors have further recognized that the choice of materials used to form the cavity bottom layer can affect operation of the device and/or device reliability such as by altering the transmit pressure of the cavity. For example, the choice of dielectric material(s) used in forming the cavity bottom layer may change the magnitude of the electric field between the membrane and the substrate, thereby changing the transmit pressure of the cavity. The inventors have recognized that forming the cavity bottom layer out of a dielectric material having a large dielectric constant may increase the size of the voltage signal generated by the CMUT during operation. In some embodiments, a dielectric material may be said to have a large dielectric constant when the dielectric constant is equal to or greater than six (6). In some embodiments the dielectric constant of a dielectric material forming the cavity bottom layer of a CMUT is in a range from 3.9 to 50 or in a range from 6.0 to 50. In some embodiments, the dielectric material may be one of silicon dioxide ($SiO_2$), silicon nitride ($Si_3N_4$), hafnium oxide ($HfO_2$), strontium ruthenate ($SrRuO_3$), and/or barium titanate ($BaTiO_3$).

The inventors have further recognized that such dielectric materials may exhibit lower breakdown voltages than other oxide materials, thus reducing the reliability of the CMUT over time. Accordingly, the inventors have developed methods to electrically isolate the pedestal structure from the CMUT electrode to reduce charging effects on the pedestal surfaces. By electrically isolating the pedestal structures of the cavity bottom layer from the electrode, the likelihood of breakdown across the dielectric material layer may be reduced.

Various aspects of the present disclosure may be used alone, in combination, or in a variety of arrangements not explicit in the embodiments described in the foregoing such that the present disclosure is not limited in its application to the details and arrangement of components set forth in the foregoing description or illustrated in the drawings. For example, aspects described in one embodiment may be combined in any manner with aspects described in other embodiments.

FIG. 1 illustrates a side view of a CMUT 100 in a non-collapsed position. The CMUT includes a membrane 102, sidewalls 104, a cavity bottom layer 106, a substrate 108, and a cavity 110. The cavity 110 is disposed between the membrane 102 and the cavity bottom layer 106. The sidewalls 104 are also disposed between the membrane 102 and the cavity bottom layer 106 at the perimeter of the cavity 110. The cavity bottom layer 106 is disposed on the substrate 108, which is on the opposite side of the cavity bottom layer 106 as the cavity 110. The cavity bottom layer 106 (and any other cavity bottom layers described herein) may be considered the bottom surface of the cavity 110. In some embodiments, the substrate 108 may include multiple layers, including a metal sensing layer. The cavity bottom layer 106 (and any other cavity bottom layer described herein) may be considered adjacent to the substrate 108 in that the cavity bottom layer 106 is on the same side of the cavity 110 as the substrate 108, rather than being on the same side of the cavity 110 as the membrane 102.

In operation, the membrane 102 may vibrate up and down in response to a time-varying voltage applied across the cavity 110 (i.e., between the membrane 102 and the substrate 108), thus varying a height of the cavity. This vibration of the membrane 102 may cause transmission of ultrasound waves. In addition, in response to reception of ultrasound waves, the membrane 102 may vibrate up and down, thereby generating a time-varying voltage across the cavity 110 (i.e., between the membrane 102 and the substrate 108) which can be detected. Prior to transmission or reception of ultrasound waves, the membrane 102 may be in the non-collapsed position illustrated in FIG. 1. In the non-collapsed position, the membrane 102 does not contact the cavity bottom layer 106.

Figure 2:
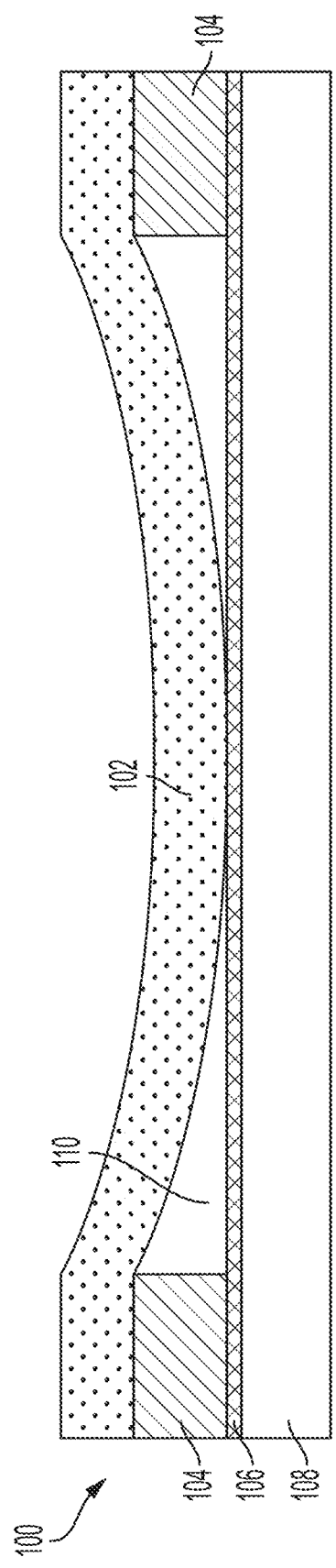
FIG. 2 illustrates a side cross-sectional view of the CMUT of FIG. 1 in a collapsed position.

FIG. 2 illustrates a side view of the CMUT 100 in a collapsed position. During transmission or reception of ultrasound waves, the membrane 102 may move into the collapsed position illustrated in FIG. 2, in which the membrane 102 has moved down sufficiently far that it contacts the cavity bottom layer 106. In some embodiments, the membrane may be intentionally brought into contact with the cavity bottom layer 106 by applying a suitable bias voltage across the cavity. Whether the membrane 102 is intentionally or unintentionally brought into contact with the cavity bottom layer 106, it may be desirable for the membrane 102 to return to the non-collapsed position illustrated in FIG. 1 at some point, for instance after transmission or reception of ultrasound waves. However, due to various mechanisms such as surface charging or surface energy, the membrane 102 may remain stuck to the cavity bottom layer 106, a phenomenon that may be referred to as membrane stiction. Membrane stiction may be undesirable as it may result in the CMUT 100 operating poorly or ceasing to operate.

Figure 3:
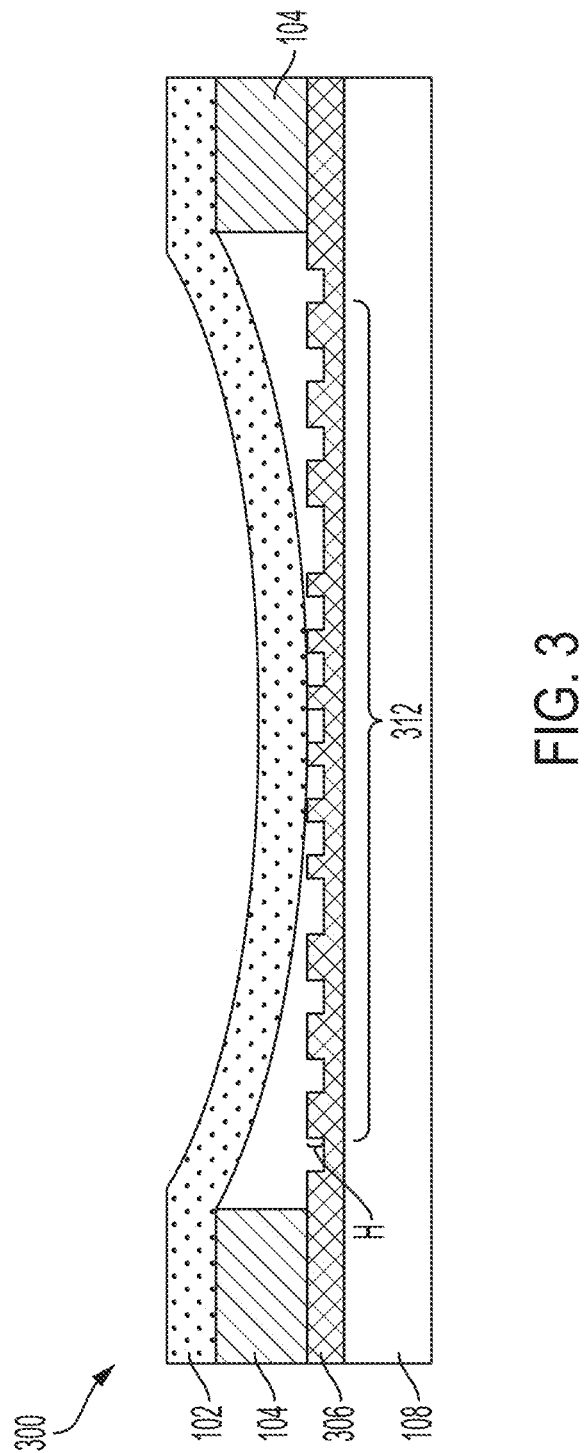
FIG. 3 illustrates a side cross-sectional view of another CMUT in a collapsed position, the CMUT including pedestals on a surface opposite the membrane, in accordance with certain embodiments of the present disclosure.

FIG. 3 illustrates a side view of another CMUT 300 that includes non-uniform pedestals, in accordance with certain embodiments described herein. The CMUT 300 is the same as the CMUT 100 except that the CMUT 300 includes a cavity bottom layer 306, which differs from the cavity bottom layer 106 of FIG. 1. The cavity bottom layer 306 includes non-uniform pedestals 312 protruding from a surface of the cavity bottom layer 306 into the cavity 110 and towards the membrane 102.

Pedestals 312 may be helpful in reducing membrane stiction due to a reduction of the contact area between the membrane 102 and the cavity bottom layer. For example, the contact area between membrane 102 and cavity bottom layer 306 in FIG. 3 will be less than that between membrane 102 and cavity bottom layer 106 due to the cavity bottom layer 306 having a non-uniform surface in the form of non-uniform pedestals 312, presuming all other dimensions, materials, and operating conditions of the CMUTs 100 and 300 are the same as each other.

The pedestals described herein may be understood to be larger in height than the surface roughness of the cavity bottom layer (e.g., cavity bottom layer 306) itself. In some embodiments, the surface roughness of the cavity bottom layer may be approximately 5 Angstroms (Å) or in a range from 2.5 Å to 10 Å. In some embodiments, the difference in height between the pedestals and the surface roughness of the cavity bottom layer may be more than 10 times greater than the surface roughness of the cavity bottom layer. In some embodiments, the pedestals may protrude from the cavity bottom layer and have a height H above a surface of the cavity bottom layer that is at least 20 nanometers (nm), at least 25 nm, or at least 30 nm. In some embodiments, the pedestals may protrude from the cavity bottom layer and have a height H above a surface of the cavity bottom layer that is in a range from 20 nm to 100 nm.

The non-uniform pedestals 312 may include a subset (i.e., one or more, but fewer than all) of pedestals having at least one characteristic that is different than another subset of the non-uniform pedestals 312. In some embodiments, a subset of the non-uniform pedestals 312 may have a different top surface area than that of another subset of the non-uniform pedestals 312. Top surface area refers to the area of the top surface of the pedestal, namely the surface facing the membrane 102. As another example, a subset of the non-uniform pedestals 312 may be separated by a pitch that is different than that separating another subset of the non-uniform pedestals 312. Pitch may be determined as the distance between the centroids of the top surfaces of two adjacent pedestals. In some embodiments, more than two subsets of the non-uniform pedestals 312 may have different characteristics. In some embodiments, each of three, four, five, or six subsets may have different characteristics than the other subsets. In some embodiments, a subset (i.e., one or more, but fewer than all) of the non-uniform pedestals 312 may have two or more characteristics (e.g., two, three, four, five, or six) that are different than those characteristics of another subset of the non-uniform pedestals 312.

In some embodiments, two subsets of the non-uniform pedestals 312 may be considered to have different characteristics when, for a certain quantifiable property of the non-uniform pedestals 312, the average value of that property among all pedestals in one subset is different than the average value of that property among all pedestals in the other subset. As one example, two subsets of the non-uniform pedestals 312 may have different top surface areas if the average value of the top surface areas of the pedestals in the first subset is different than the average value of the top surface areas of the pedestals in the second subset. As another example, two subsets of the non-uniform pedestals 312 may have different pitches separating the pedestals of those two subsets if the average value of the pitch between adjacent pairs of pedestals in the first subset is different than the average value of the pitch between adjacent pairs of pedestals in the second subset.

In some embodiments, a first average value may be considered to be different than a second average value when the first average value is different from the second average value by a threshold percentage of the second average value. For example, in those embodiments in which the average top surface area of a first subset of the pedestals differs from the average surface area of a second subset of the pedestals, the threshold percentage may be in a range from 5% to 400%, in a range from 50% to 200%, or in a range from 80% to 120%, including any value or range of values within these ranges. As another example, in those embodiments in which the average diameter of a first subset of the pedestals differs from the average diameter of a second subset of the pedestals, the threshold percentage may be in a range from 1% to 100%, in a range from 5% to 50%, or in a range from 20% to 40%, including any value or range of values within these ranges. As another example, in those embodiments in which the average pitch of a first subset of the pedestals differs from the average pitch of a second subset of the pedestals, the threshold percentage may be in a range from 1% to 200%, in a range from 5% to 150%, or in a range from 80% to 120%, including any value or range of values within these ranges.

In some embodiments, the average values of the characteristics of the non-uniform pedestals 312 may depend on the positions of the non-uniform pedestals 312. A first subset of the non-uniform pedestals 312 at certain positions may have one average value of one or more characteristics (e.g., a certain top surface area, diameter, and/or a certain pitch) and a second subset of the non-uniform pedestals 312 at different positions may have a different average value of one or more characteristics (e.g., a different top surface area, diameter, and/or a different pitch). The different positions may be, for example, within different regions of the cavity bottom layer 306. As a further example, the average values of the characteristics of subsets of the non-uniform pedestals 312 may depend on the relative positioning of the subsets along a radius of the cavity. For example, a first subset of pedestals may be in an inner region of a cavity bottom layer and a second subset of pedestals may be in an outer region of the cavity bottom layer when the average value of the distance of each pedestal in the first group from the centroid of the cavity bottom layer is less than the average value of the distance of each pedestal in the second group from the centroid of the bottom surface of the cavity The inventors have recognized that non-uniform pedestals may be helpful in improving operation and/or device reliability such as longevity of a CMUT. For example, the inventors have recognized that, in certain regions of a CMUT, pedestals having a certain characteristic may be helpful, while in other regions of a CMUT, pedestals having different characteristics may be helpful, since the importance of stiction, sensing sensitivity, and/or impact force to the overall operation and longevity of the CMUT may differ by region.

Figure 4A:
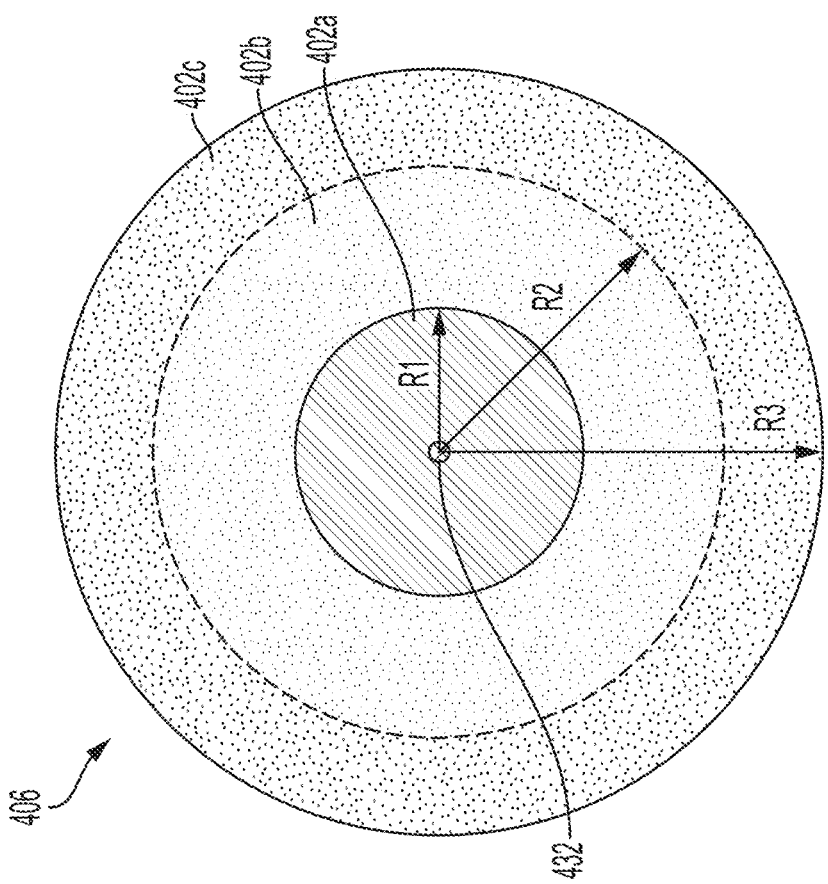
FIGS. 4A and 4B illustrate a top-down view of a CMUT including electrically isolated pedestals, in accordance with certain embodiments of the present disclosure.
Figure 4B:
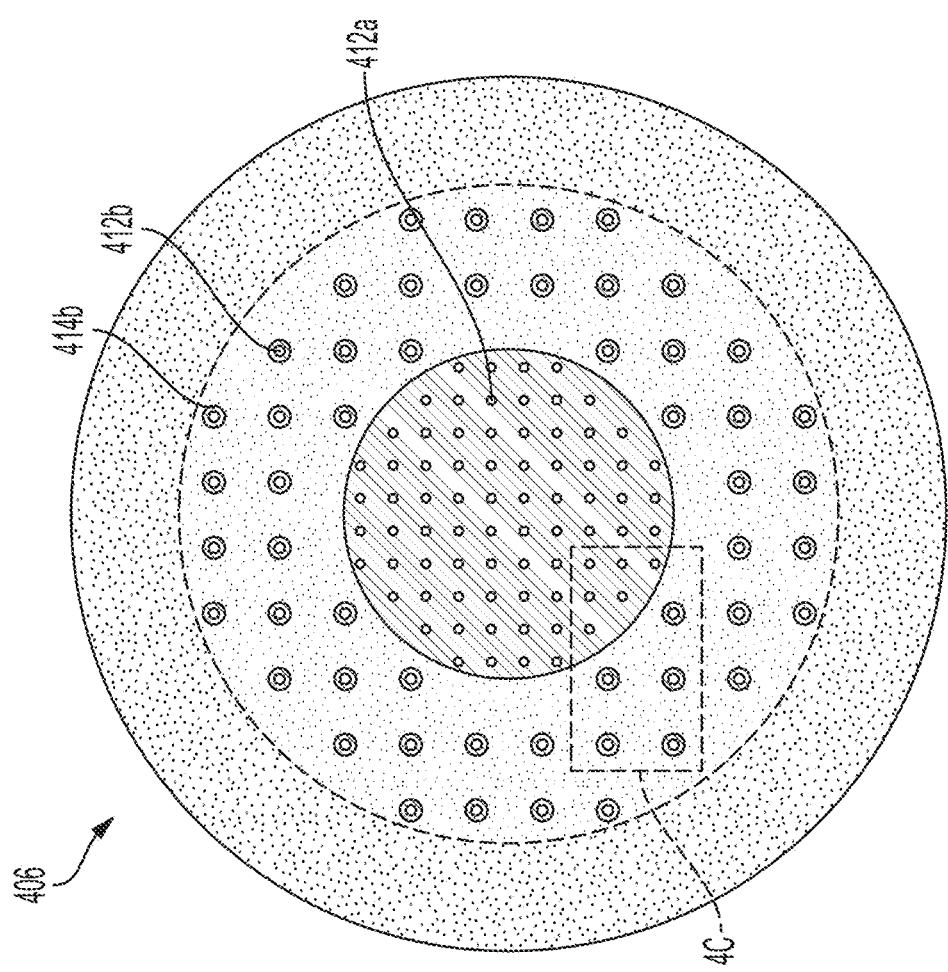

FIG. 4A illustrates a top view of three regions of a cavity bottom layer 406 of a CMUT in certain embodiments of the present disclosure. The illustrated cavity bottom layer 406 is an example implementation of cavity bottom layer 306 of FIG. 3 and may form part of CMUT 500 described below in connection with FIG. 5J. Referring to FIGS. 4A and 4B, the three regions include an inner region 402a, a middle region 402b, and an outer region 402c radially separated from each other. It should be appreciated that some embodiments may include 2 to 5 regions.

Figure 5A:
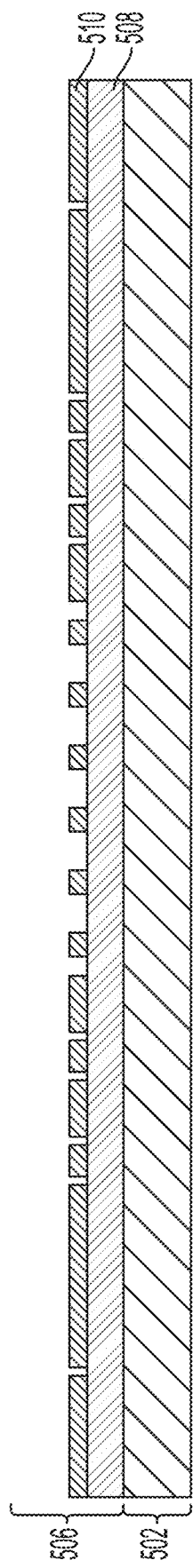
Figure 5B:
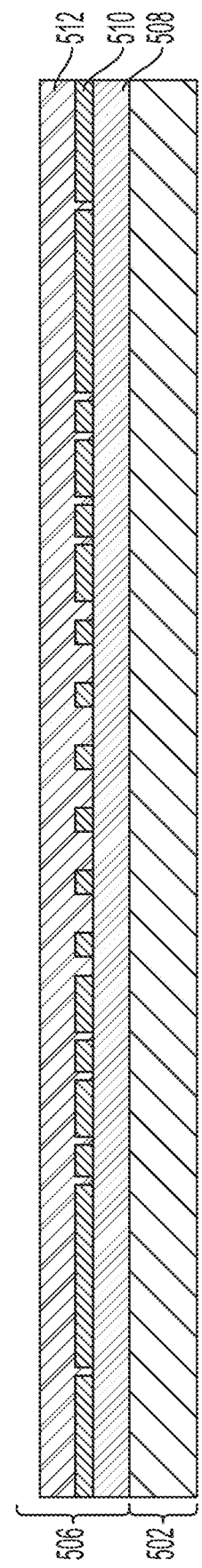
Figure 5C:
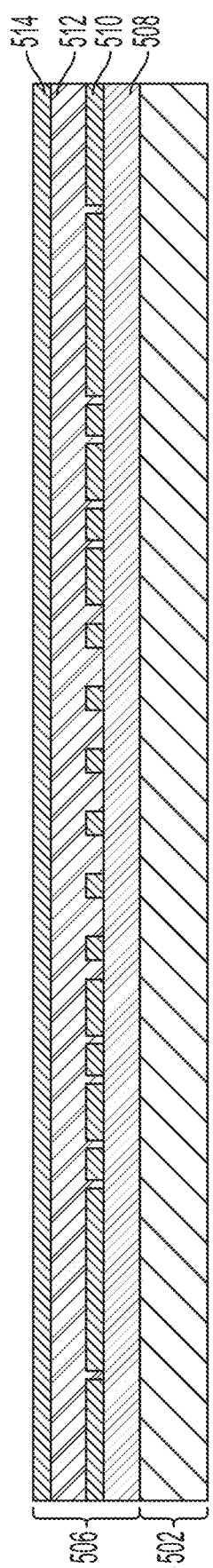
Figure 5D:
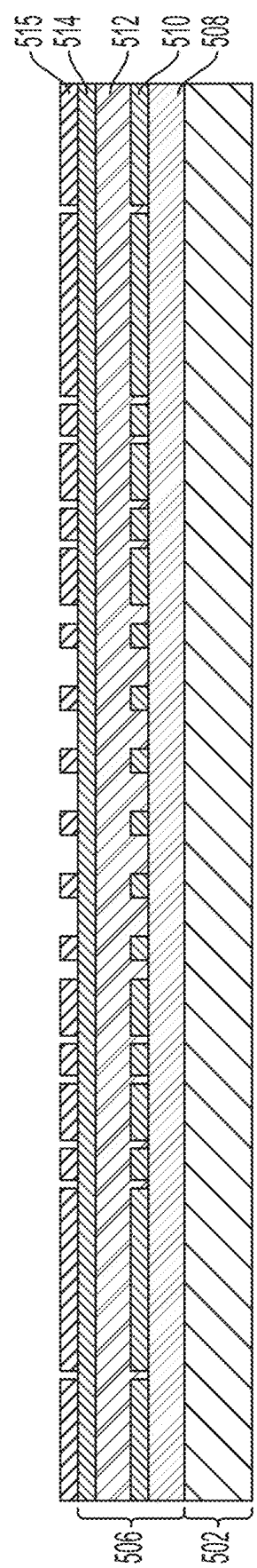
Figure 5E:
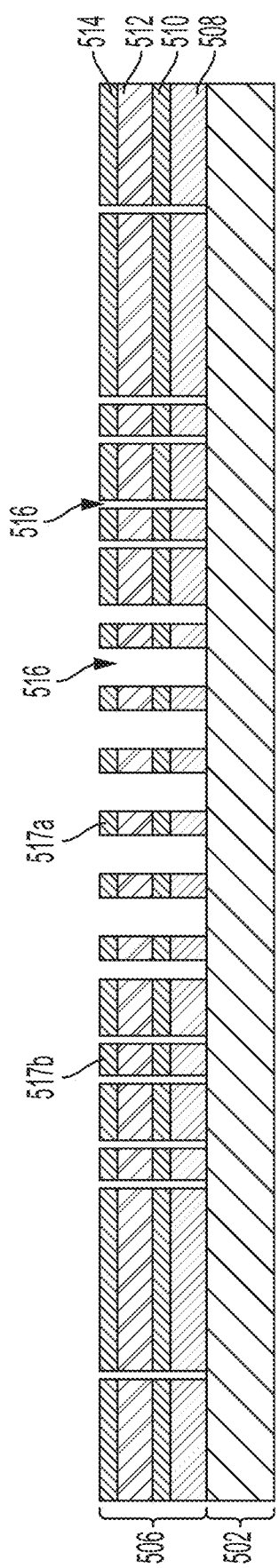
Figure 5F:
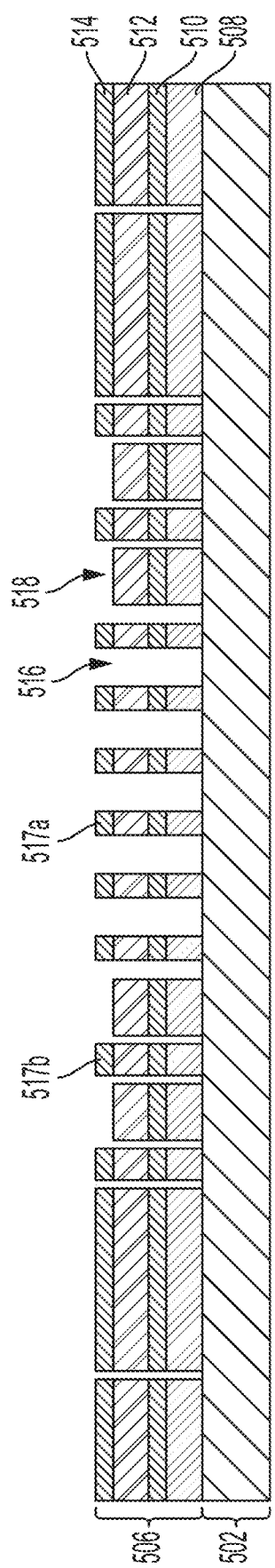
Figure 5I:
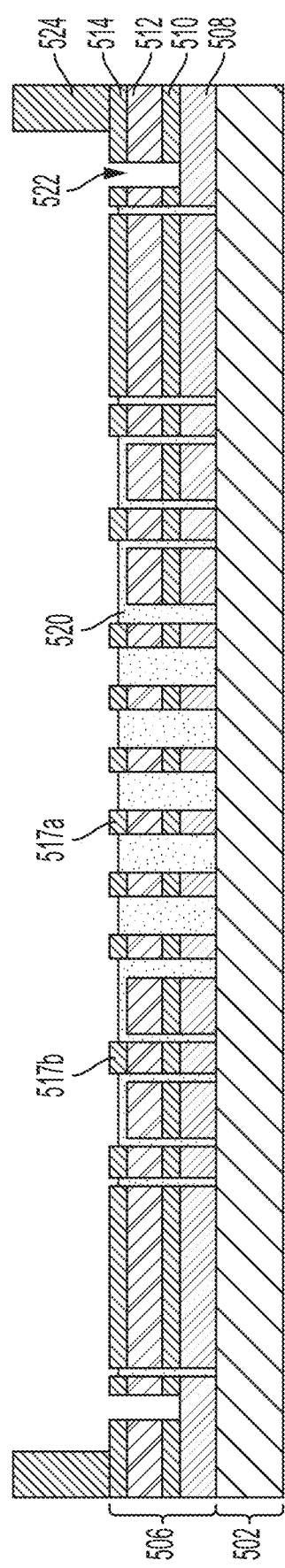
Figure 5J:
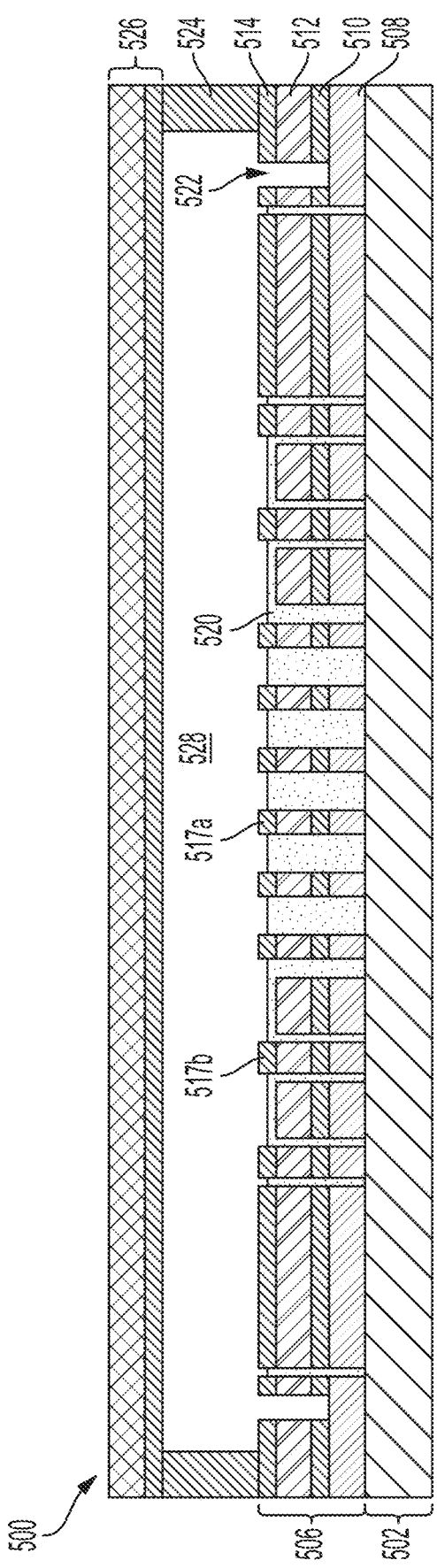

In collapsed mode operation, the CMUT membrane—not shown in the top views of FIGS. 4A and 4B but shown in the side view of FIG. 5J—may contact at least part of the inner region 402a and vibrate above the middle region 402b and the outer region 402c. The middle region 402b and outer region 402c may, therefore, function as the sensing region of the CMUT. In some embodiments, the inner region 402a lacks an electrode layer. In some embodiments, the inner region 402a is electrically isolated from an electrode layer of middle region 402b and outer region 402c since the inner region 402a does not act as a sensing region.

Referring to FIG. 4A, the inner region 402a is a circle or approximately a circle, centered at the centroid 432 of the cavity bottom layer 406. The inner region 402a has a radius $R_1$. In some embodiments, the value of $R_1$ may be in a range from 0 to 50 microns, in a range from 20 to 40 microns, or approximately 30 microns, including any range or values within those ranges.

In some embodiments, the middle region 402b is an annular ring or approximately an annular ring, centered at the centroid 432 of the cavity bottom layer 406. The middle region 402b has an inner radius $R_1$ and an outer radius $R_2$. The value of $R_2$ may be in a range from 110 to 140 microns, including any range or values within those ranges. For example, the value of $R_2$ may be approximately 120 microns.

In some embodiments, the outer region 402c is an annular ring or approximately an annular ring, centered at the centroid 432 of the cavity bottom layer 406. The outer region 402c has an inner radius $R_2$ and an outer radius $R_3$. $R_1$ is less than $R_2$ and $R_2$ is less than $R_3$. The value of $R_3$ may be in a range from 160 to 200 microns, including any range or values within those ranges. For example, the value of $R_3$ may be approximately 180 microns.

FIG. 4B illustrates a top view of non-uniform, electrically isolated pedestals formed in two of the three regions (the inner region 402a and the middle region 402b) of the cavity bottom layer 406. Inner pedestals 412a are formed in the cavity bottom layer 406 within the inner region 402a. Middle pedestals 412b are formed in the cavity bottom layer 406 within the middle region 402b and are electrically isolated from the electrode layers by trenches 414b as shown in more detail in FIG. 4C. In some embodiments, the inner pedestals 412a and middle pedestals 412b may total between 50 and 500 pedestals. For example, the inner pedestals 412a may total between 50 and 300 pedestals, and the outer pedestals 412b may total between 30 and 200 pedestals. As one specific example, the cavity bottom layer 406 may include 76 inner pedestals 412a and 52 middle pedestals 412b.

The inner pedestals 412a and the middle pedestals 412b of the example of FIG. 4B represent an implementation of the non-uniform pedestals 312 of FIG. 3. The inner pedestals 412a and the middle pedestals 412b may be non-uniform in that the inner pedestals 412a have at least one characteristic different from that of the middle pedestals 412b. The at least one characteristic may be top surface area, pitch, or both top surface area and pitch.

Figure 4C:
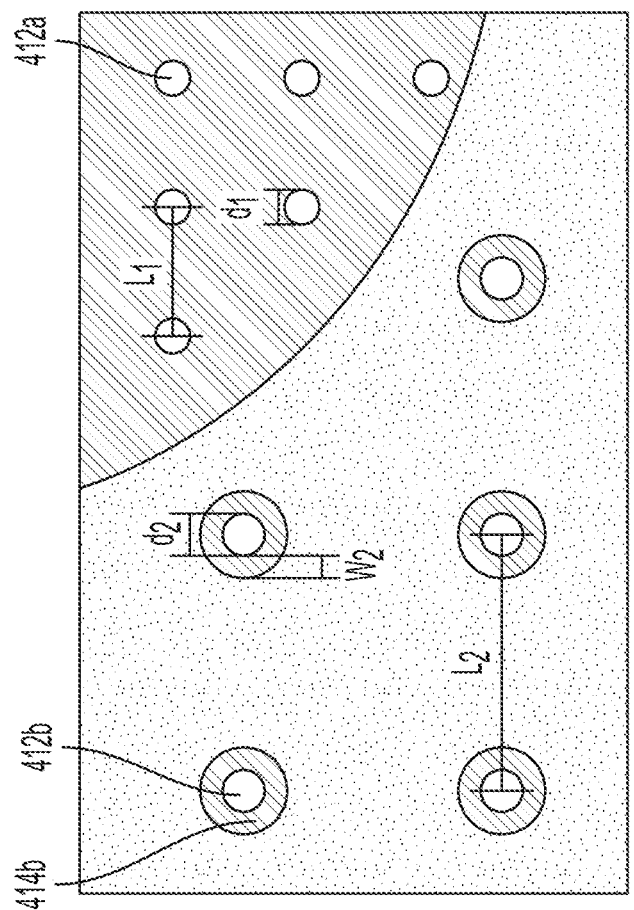
FIG. 4C illustrates a detailed view of the CMUT of FIG. 4B, in accordance with certain embodiments of the present disclosure.

In FIGS. 4B and 4C, the inner pedestals 412a and the middle pedestals 412b are circular or approximately circular, such that the top surface area of a given pedestal having a diameter d may be equal to or approximately equal to $\pi d^2/4$. The diameter of the inner pedestals 412a may be given as $d_1$ and the diameter of the middle pedestals 412b may be given as $d_2$. The top surface area of the inner pedestals 412a will be referred to as $SA_1 = \pi d_1^2/4$. The top surface area of the middle pedestals 412b will be referred to as $SA_2 = \pi d_2^2/4$. The pitch separating the inner pedestals 412a may be given as $L_1$ and the pitch separating the middle pedestals 412b may be given as $L_2$. In some embodiments, $SA_1$ and $SA_2$ are different. In some embodiments, $L_1$ and $L_2$ are different. In some embodiments, $SA_1$ and $SA_2$ are different and $L_1$ and $L_2$ are different. As described above, a particular value for a property of a set of pedestals (e.g., the diameter of a set of pedestals, the surface area of a set of pedestals, or the pitch of a set of pedestals) may refer to an average value of that property for the pedestals in the set. For example, $SA_1$ may be the average value of the top surface areas of the inner pedestals 412a, $d_1$ may be the average value of the diameters of the inner pedestals 412a, and $L_1$ may be the average value of the pitch separating adjacent pairs of the inner pedestals 412a.

The particular values for $d_1$ in FIG. 4C, and therefore the particular values for $SA_1$, and the values for $L_1$ may be selected in dependence on the characteristics of the inner region 402a during operation of the CMUT in a collapse mode. Without being bound by theory, in the examples of FIGS. 4A, 4B, and 4C, the inner region 402a may exhibit larger surface charging effects, because the membrane may be in a state in which the area of contact with the cavity bottom layer 406 is greatest towards the center of the CMUT. Thus, it may be helpful for the inner pedestals 412a in the inner region 402a to have a small top surface area $SA_1$, and therefore a small diameter $d_1$, in order to reduce effects of parasitic capacitance and improve the performance of the CMUT 500. As a result of the smaller top surface area $SA_1$, the inner pedestals 412a may be less mechanically robust. It may therefore be helpful to have a smaller the pitch $L_1$ to prevent mechanical damage to the inner pedestals 412a during operation of the CMUT. For example, the value of $d_1$ may be in a range from 0.5 to 2 microns, or in a range from 1 to 1.5 microns, including any range or values within those ranges. The value of $L_1$ may be in a range from 4 to 8 microns, in a range from 5 to 7 microns, or may be six (6) microns, including any range or values within those ranges.

The particular values for $d_2$, and therefore the particular values for $SA_2$, and the values for $L_2$ may be selected in dependence on the characteristics of the middle region 402b during operation of the CMUT in a collapse mode. For example, the electrode layers disposed in the middle region 402b may provide more signal sensitivity than the electrode layers in the outer region 403b because the membrane may vibrate with a greater amplitude above the middle region 402b during operation of the CMUT. For this reason, it may be helpful for the middle pedestals 412b to be reduced in number—and to have a larger pitch $L_2$—to provide more sensing area in the middle region 402b as the middle pedestals 412b and trenches 414b do not provide any sensing capabilities. To withstand the mechanical forces of the oscillating electrode while being disposed according to the larger pitch $L_2$, the middle pedestals 412b may have a larger top surface area $SA_2$, and therefore a larger diameter $d_2$. For example, the value of $d_2$ may be in a range from 1 to 3 microns, from 1.5 to 2.5 microns, or may be 2 microns, including any range or values within those ranges. The pitch $L_2$ may be in a range from 6 to 12 microns, or from 8 to 10 microns, including any range or value within those ranges. To further minimize loss of sensing area, the width of the trenches 414b may be in a range from 0.5 to 1.5 microns, in a range from 0.75 to 1.25 microns, or may be 1 micron, including any range or values within those ranges.

The outer region 402c lacks pedestals. Outer region 402c is positioned at the periphery of the cavity bottom layer 406 and therefore is less likely to come into contact with the CMUT membrane during operation of the CMUT. Additionally, the portion of the CMUT membrane overlying outer region 402c may exhibit a greater restoring force than the portions of the membrane overlying inner region 402a and middle region 402b. As a result, the chance of stiction occurring in the outer region 402c is less than for the inner region 402a and the middle region 402b. At the same time, the outer region 402c may contribute significantly to the sensitivity of the CMUT, particularly when operating in collapse mode. Thus, the outer region 402c may be provided without pedestals to avoid the reduction in top surface area resulting from the inclusion of pedestals.

The middle region 402b includes middle pedestals 412b having a greater top surface area than that of the inner pedestals 412a. The positioning of the middle region 402b is such that the overlying membrane is more likely to contact that region than the outer region 402c. The restoring force of the portion of the membrane overlying the outer region 402c may be greater than the restoring force of the portion of the membrane overlying middle region 402b. Therefore, it is desirable to include middle pedestals 412b, as they may reduce the chance of stiction between the membrane and the middle region 402b. However, the top surface areas of the middle pedestals 412b may be greater than the top surface areas of the inner pedestals 412a for a variety of reasons. First, the chance of stiction between the membrane and the inner region 402a may be greater than the chance of stiction between the membrane and the middle region 402b since the membrane may stay in contact with the inner region 402a during collapse mode operation. Second, the middle region 402b may also sustain more impact force from the membrane than the inner region 402a. Thus, the middle pedestals 412b may be sized to be sufficiently robust to withstand such impact, for example by being wider than the inner pedestals 412a and therefore having larger top surface areas than the inner pedestals 412a. Third, providing fewer middle pedestals 412b than inner pedestals 412a may be beneficial since each middle pedestal 412b is electrically isolated from the electrode by a trench 414b. All other things being equal, the greater the number of middle pedestals 412b, the greater the amount of electrode removed from the sensing region of the CMUT, thereby reducing the sensitivity of the CMUT. Thus, providing the middle pedestals 412b with a larger top surface area $SA_2$, and therefore a larger diameter $d_2$, than the inner pedestals 412a may be beneficial so that fewer, more mechanically robust middle pedestals 412b may be used. However, in some other CMUTs, it may be optimal for the middle pedestals to have smaller top surface areas than the outer pedestals and/or the inner pedestals, based on the particular factors relevant to that CMUT.

The particular values for $L_1$ and $L_2$ shown in FIG. 4C may also be selected based on the dominant factors influencing the function of the inner pedestals 412a and the middle pedestals 412b. Stiction may be a more significant problem in the middle region 402b because movement of the membrane relative to the cavity bottom layer 406 may occur with the largest amplitude in the middle region of the CMUT. Thus, providing a larger pitch $L_2$ in the middle region 402b reduces the number of middle pedestals 412b compared to if a smaller pitch $L_2$ were provided, and thereby reduces the top surface area of the middle region 402b, which in turn reduces the chance of stiction between the membrane and the middle region 402b. As described above, the inner pedestals 412a may have top surface areas selected to reduce effects of parasitic capacitance. To increase the mechanical robustness of the inner pedestals 412a, it may be helpful to decrease the pitch $L_1$ so as to increase the number of inner pedestals 412a. By packing the inner pedestals 412a more densely, they may withstand the additional contact force from the membrane in the inner region 402a. However, in some other CMUTs, it may be optimal for the inner pedestals to have a larger pitch than the middle pedestals, based on the particular factors relevant to that CMUT.

The inner pedestals 412a and middle pedestals 412b have circular top surfaces, or approximately circular top surfaces. However, alternative embodiments employ pedestals of different shapes, such as pedestals having top surfaces that are ovals, squares, rectangles, hexagons, or that have irregular contours. It should further be appreciated that while the examples in FIGS. 4A, 4B, and 4C include non-uniform pedestals, some embodiments include uniform pedestals (e.g., uniform in top surface area and/or in pitch between the pedestals) across the regions of the CMUT.

FIGS. 5A-5J illustrate cross-sectional views of a CMUT fabrication sequence for fabricating a CMUT with electrically isolated, non-uniform pedestals, in accordance with certain embodiments described herein. FIG. 5A illustrates a sensing metal layer 508 and an oxide layer 510. The sensing metal layer 508 is supported by a substrate 502. In some embodiments, the substrate 502 may be a silicon substrate that includes integrated circuitry for ultrasound imaging. The substrate 502 may further include one or more metal routing layers and vias (not illustrated) that electrically couple the integrated circuitry in the substrate to the sensing metal layer 508. The sensing metal layer 508 may include, for example, titanium (Ti), and may be formed on the substrate 502 using any suitable metal deposition process. In some embodiments, the integrated circuitry in the substrate may provide electrical signals to the sensing metal layer 508 and receive and process electrical signals from the sensing metal layer 508.

In some embodiments, the sensing metal layer 508 may include, for example, a layered structure formed on the substrate 502. For example, the sensing metal layer 508 may be a multi-layered metal structure including alternating layers of Ti and titanium nitride (TiN). Alternating the layers of Ti and TiN may reduce "hillocks" or other features that cause surface roughness developing in the sensing metal layer 508 during the deposition of the Ti and TiN layers. The layers of Ti and TiN may be deposited using physical vapor deposition techniques. For example, the layers of Ti and TiN may be deposited using sputtering and/or evaporative deposition techniques.

In some embodiments, the layers of Ti and TiN may comprise five layers. A seed layer of TiN having a thickness in a range from 30 to 50 Angstroms (Å) may be first deposited on the substrate 502. Thereafter, a first layer of Ti having a thickness in a range from 800 to 1200 Å may be deposited on the seed layer of TiN. After the first layer of Ti is deposited, another layer of TiN having a thickness in a range from 300 to 500 Å may be deposited. Then, a second layer of Ti having a thickness in a range from 800 to 1200 Å may be deposited, followed by a final layer of TiN having a thickness in a range from 300 to 500 Å.

In FIG. 5A, an oxide layer 510 is formed on the sensing metal layer 508 as a first layer in the cavity bottom layer 506. The oxide layer 510 may include, for example, silicon dioxide, or another dielectric. The oxide layer 510 may be, for example, 10-30 nm thick. The oxide layer 510 may be deposited on the sensing metal layer 508 using chemical vapor deposition (CVD) in some embodiments.

In FIG. 5B, a dielectric layer 512 is formed on the oxide layer 510 as a second layer in the cavity bottom layer 506. The dielectric layer 512 may include a dielectric material having a large dielectric constant. A dielectric constant may be considered large when the dielectric constant is equal to or greater than 3.9, in a range from 3.9 to 50, equal to or greater than 6, or in a range from 6 to 50. For example, in some embodiments, the dielectric layer 512 may include one of silicon dioxide ($SiO_2$), silicon nitride ($Si_3N_4$), or hafnium oxide ($HfO_2$). Alternatively, the dielectric layer 512 may include other high-K dielectrics such as, for example, $SrRuO_3$ and/or $BaTiO_3$. The dielectric layer 512 may be, for example, 100-300 nm thick. The dielectric layer 512 may be deposited on the oxide layer 510 and sensing metal layer 508 using, for example, chemical vapor deposition (CVD).

In FIG. 5C, a layer 514 is formed on the dielectric layer 512 as a third layer in the cavity bottom layer 506. The layer 514 may include, for example, silicon dioxide, or any other suitable insulating material. The layer 514 may be, for example, 10-30 nm thick. The layer 514 may be deposited on the dielectric layer 512 using, for example, chemical vapor deposition (CVD).

In FIG. 5D, a mask 515 is patterned over the layer 514. For example, the mask 515 may be produced using lithography techniques (e.g., photolithography) and may be formed of a light-sensitive material (e.g., photoresist). In FIG. 5E, the mask 515 is used as an etch mask to form trenches 516. The trenches 516 may be formed through layer 514, dielectric layer 512, oxide layer 510, and the sensing metal layer 508. The trenches 516 are formed to electrically isolate pedestals 517a and 517b in the cavity bottom layer 506 from the portions of the sensing metal layer 508 that are electrically coupled to the metal routing layers and integrated circuitry of the substrate 502. The trenches 516 may be formed using a dry etch process (e.g., reactive-ion etching (RIE), or deep reactive-ion etching (DRIE)). After forming trenches 516, the mask 515 is removed.

In FIG. 5F, portions of the layer 514 may be removed from regions 518 of the cavity bottom layer 506 that are disposed between pedestals 517b. The regions 518 may be formed to reduce a height of the cavity bottom layer 506 between pedestals 517b such that regions 518 do not contact the membrane 526 during operation of the CMUT 500, thereby reducing stiction forces in the regions between pedestals 517b. The regions 518 may be formed by, for example, a dry etch process (e.g., RIE, DRIE).

In FIG. 5G, an insulating material 520 may be deposited to fill the trenches between pedestals of the cavity bottom layer. The insulating material 520 may be an insulating oxide (e.g., silicon dioxide) that electrically insulates the pedestals 517a and 517b from the portions of the sensing metal layer 508 that are electrically coupled to the metal routing layers and integrated circuitry of the substrate 502. For example, the insulating material 520 may have a resistivity in a range from $1 \times 10^{15}$ Ω·m to $1 \times 10^{25}$ Ω·m. The insulating material 520 may be deposited using, for example, chemical vapor deposition (CVD).

In FIG. 5H, trenches 522 may be optionally formed in the cavity bottom layer. The trenches 522 may be formed to expose a portion of the sensing metal layer 508 so that the sensing metal layer 508 may be used as a getter. The exposed portion of the sensing metal layer 508 may be electrically isolated from the portions of the sensing metal layer 508 that are used to sense motion of the CMUT membrane during operation of the CMUT 500. The trenches 522 may be formed by using an etch process, such as, for example, a dry etch process (e.g., RIE, DRIE).

In FIG. 5I, a layer 524 is formed on the layer 514. The layer 524 defines the cavity walls of the CMUT and may comprise an insulating material. For example, the layer 524 may be silicon dioxide. The layer 524 may be, for example, 20-100 nm thick. The layer 524 may be deposited on the layer 514 using, for example, chemical vapor deposition (CVD).

In FIG. 5J, one or more layers 526 are bonded to the layer 524 to form a sealed cavity 528. In some embodiments, the one or more layers 526 may include an oxide layer (e.g., a silicon oxide) disposed on silicon, where the oxide layer of the one or more layers 526 may be disposed proximate the cavity 528 and the silicon layer of the one or more layers 526 may be disposed distal from the cavity 528.

The structure in FIG. 5J may be considered a CMUT 500 and may be an example of any of the CMUTs described herein. The one or more layers 526 may be any of the membranes described herein (e.g., the membrane 102). The layer 524 may be examples of any of the sidewalls described herein (e.g., the sidewalls 104). The cavity 528 may be an example of any of the cavities described herein (e.g., the cavity 110). The layers 508, 510, 512, and 514 may together be an example of the any of the cavity bottom layers described herein (e.g., the cavity bottom layers 306 or 406).

The layer 502 may be an example of any of the substrates described herein (e.g., the substrate 108).

While FIG. 5J illustrates the surfaces of the pedestals including the same material as the surface of other portions of the layer 520 from which pedestals protrude (i.e., the cavity bottom layer 506), in some embodiments the surfaces may include different materials. For example, there may be one or more extra additional fabrication steps in which one or more additional layers of material are formed on the pedestals, or there may be one or more extra fabrication steps in which one or more additional layers of material are formed on other portions of the layer 520 from which pedestals protrude, or both.

While FIG. 5J only illustrates ten pedestals, it should be appreciated that the process illustrated in FIGS. 5A-5J may be used to form a CMUT having fewer or more than ten non-uniform pedestals, as aspects of the technology described herein are not so limited. Further description of fabrication of a CMUT may be found in U.S. Pat. No. 9,067,779 titled "MICROFABRICATED ULTRASONIC TRANSDUCERS AND RELATED APPARATUS AND METHODS," issued on Jun. 30, 2015 (and assigned to the assignee of the instant application), the content of which is incorporated by reference herein in its entirety; and U.S. Patent Publication No. 2019/0275561 A1 titled "ULTRASOUND TRANSDUCER DEVICES AND METHODS FOR FABRICATING ULTRASOUND TRANSDUCER DEVICES," published on Sep. 12, 2019 (and assigned to the assignee of the instant application), the content of which is incorporated by reference herein in its entirety.

Figure 6:
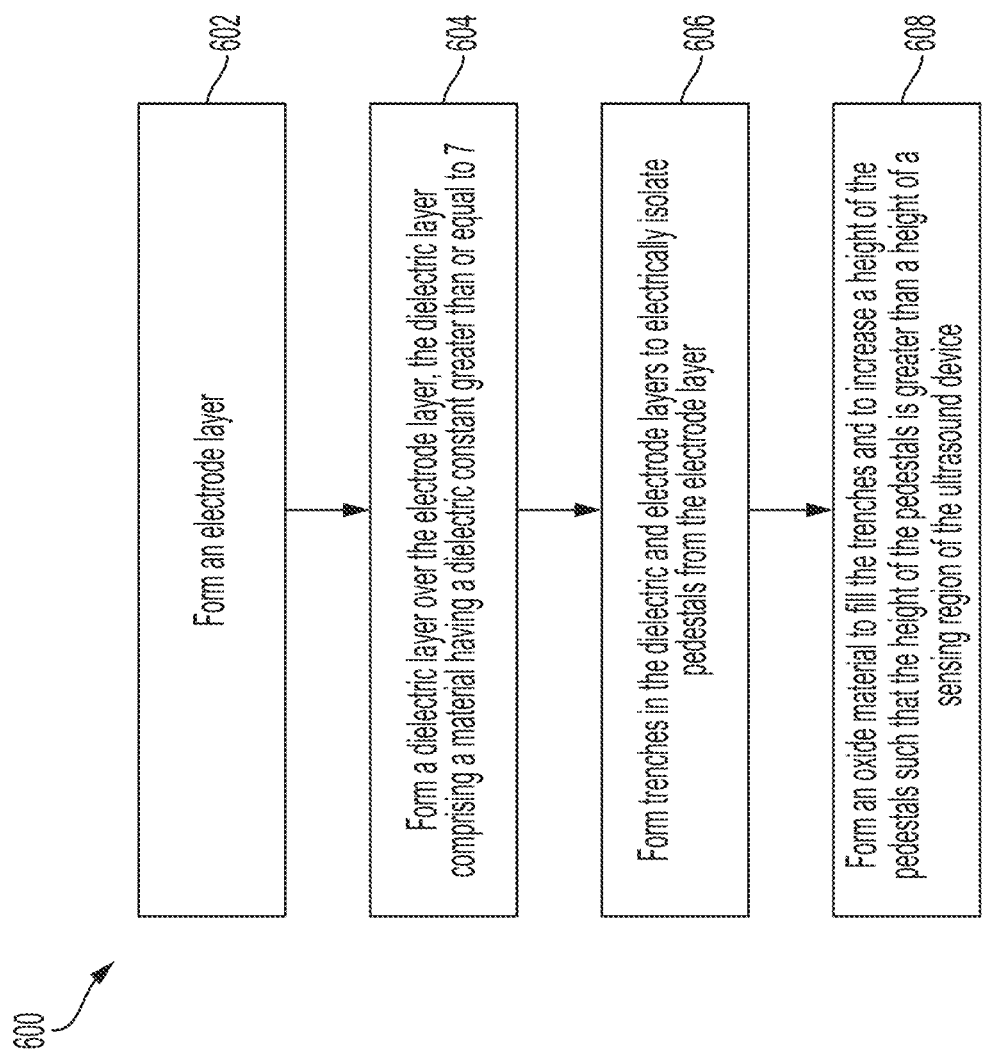
FIG. 6 is a flowchart of a process for forming a CMUT including electrically isolated pedestals, in accordance with certain embodiments of the present disclosure.

FIG. 6 illustrates a process 600 for fabricating a CMUT having electrically isolated, non-uniform pedestals. In act 602, an electrode layer (e.g., the sensing metal layer 508) is formed on a substrate. Further description of act 602 may be found with reference to FIG. 5A. In act 604, a dielectric layer (e.g., the dielectric layer 512) is formed over the electrode layer. Further description of act 604 may be found with reference to FIG. 5B. In act 606, trenches (e.g., trenches 516) are formed in the dielectric and electrode layers such that pedestals are electrically isolated from the electrode layer. Further description of act 606 may be found with reference to FIGS. 5D-5E. In act 608, an insulating material (e.g., insulating material 520) is formed to fill the trenches (e.g., trenches 516). For example, the insulating material may be an insulating oxide, in some embodiments (e.g., silicon dioxide). The insulating material may have a resistivity in a range from $1 \times 10^{15}$ Ω·m to $1 \times 10^{25}$ Ω·m. Further description of act 608 may be found with reference to FIG. 5G.

Figure 7:
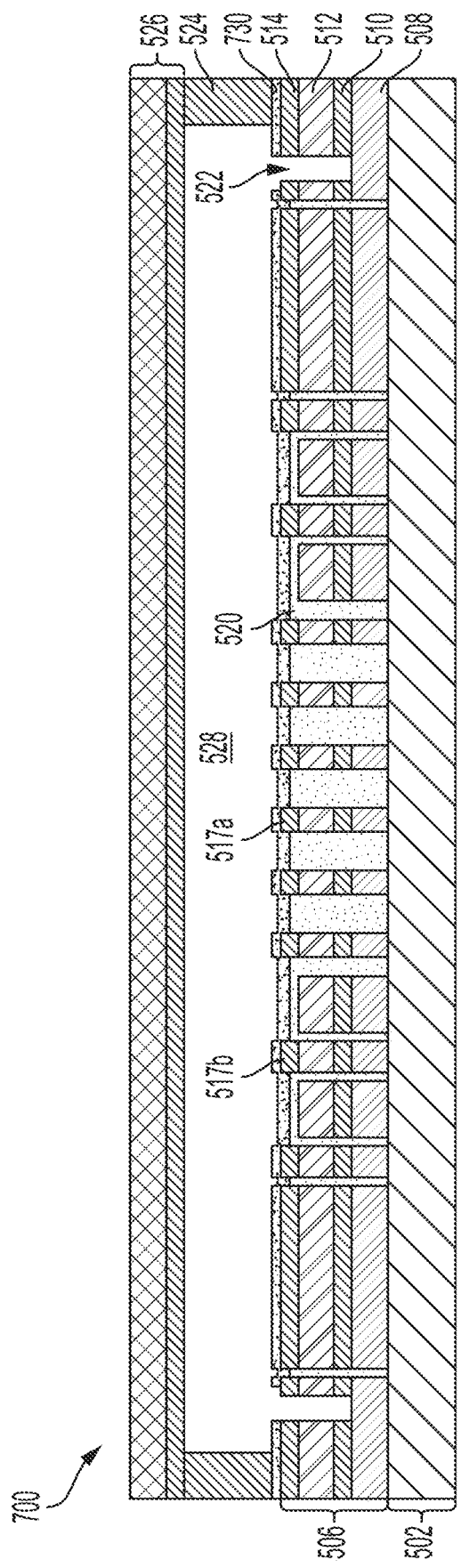
FIG. 7 illustrates a cross-sectional view of an electrode structure of a CMUT including an optional insulating layer, in accordance with certain embodiments of the present disclosure.

FIG. 7 illustrates a cross-sectional view of CMUT 700, in accordance with certain embodiments of the present disclosure. In the example of FIG. 7, the cavity bottom layer 506 includes a passivation layer 730 disposed above the layer 514 and proximate the cavity 528. The passivation layer 730 may be deposited to cover insulating material 520 (e.g., after the formation of the structure illustrated in FIG. 5G) and/or to provide additional mechanical protection to the pedestals 517a and 517b. The passivation layer 730 may be formed of an insulating material such as, for example, sapphire ($Al_2O_3$). The passivation layer 730 may be deposited using, for example, atomic layer deposition (ALD) techniques.

Figure 8:
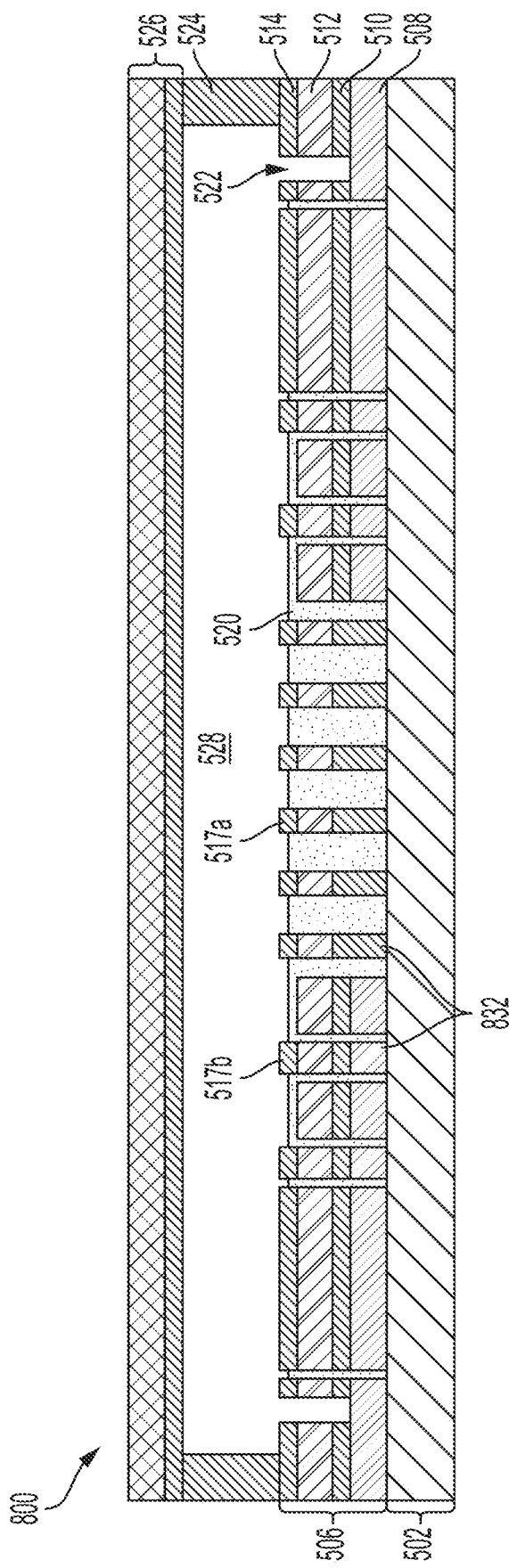
FIG. 8 illustrates an example cross-sectional view of an electrode structure of a CMUT having material of the electrode removed from under pedestals, in accordance with certain embodiments of the present disclosure.

FIG. 8 illustrates a cross-sectional view of CMUT 800, in accordance with certain embodiments of the technology described herein. In the example of FIG. 8, the bases 832 of pedestals 517a, 517b are not formed of the sensing metal layer 508. Instead, prior to the deposition of oxide layer 510 (e.g., as described in connection with FIG. 5A), portions of the sensing metal layer 508 may be etched (e.g., using a dry etching process) to remove the sensing metal layer 508 in the regions of the pedestals 517a, 517b. Thereafter, insulating material may be deposited to form the bases 832 of pedestals 517a, 517b. Insulating material 832 may be, for example, a same material as insulating layer 520 (e.g., silicon dioxide).

Figure 9:
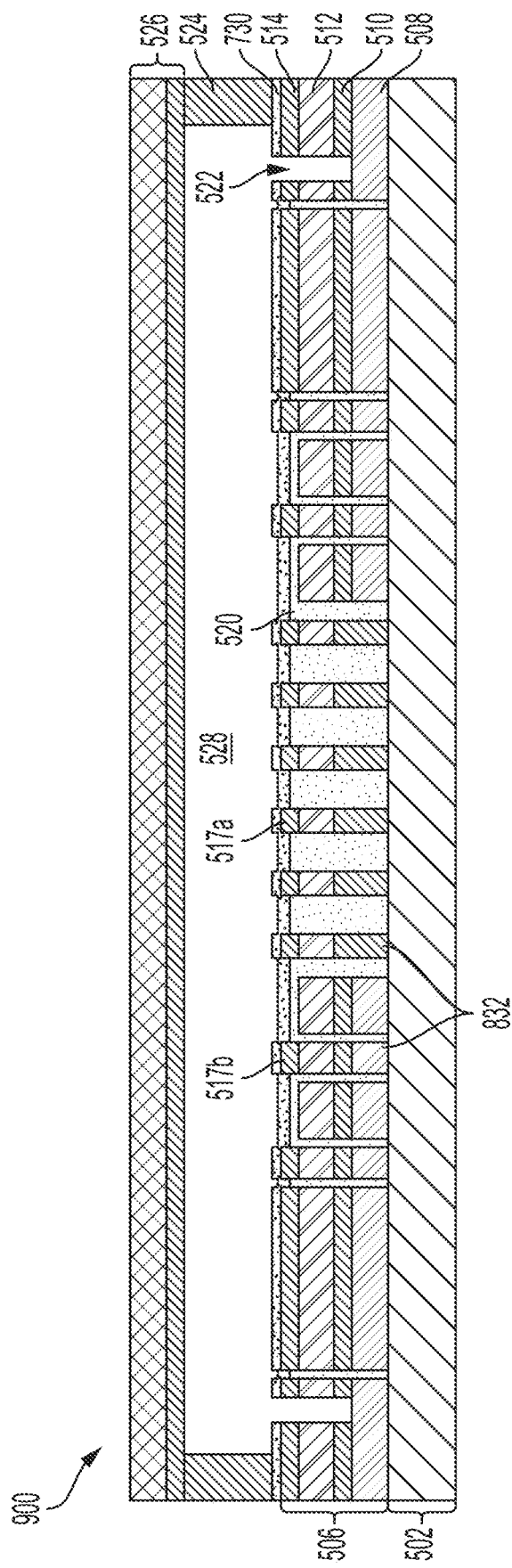
FIG. 9 illustrates an example cross-sectional view of an electrode structure of a CMUT having material of the electrode removed from under pedestals and including an optional insulating layer, in accordance with certain embodiments of the present disclosure.

FIG. 9 illustrates a cross-sectional view of CMUT 900, in accordance with certain embodiments of the technology described herein. In the example of FIG. 9, the cavity bottom layer 506 includes the additional passivation layer 730, as described in connection with FIG. 7 herein. Additionally, in the example of FIG. 9, the bases 832 of pedestals 517a, 517b are formed of an insulating material, as described in connection with FIG. 8 herein.

Figure 10:
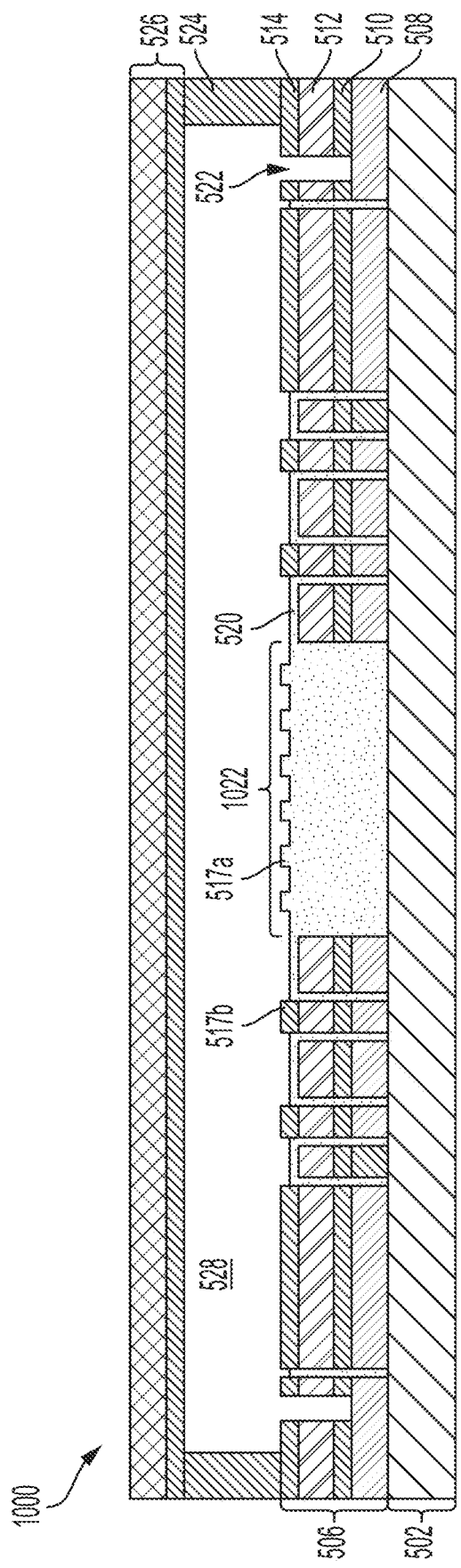
FIG. 10 illustrates an example cross-sectional view of another CMUT including electrically isolated pedestals in the electrode region of the transducer, in accordance with certain embodiments of the present disclosure.

FIG. 10 illustrates a cross-sectional view of CMUT 1000, in accordance with certain embodiments of the technology described herein. In the example of FIG. 10, the region 1022 (e.g., corresponding to the inner region 402a of FIGS. 4A, 4B, and 4C) includes only material of the layer 520. The layer 520 may be patterned to include pedestals 517a that extend beyond a surface of the layer 520 (e.g., by an additional deposition and/or etching step). The pedestals in region 1022 may be formed solely of the material of layer 520 and may not include the dielectric material of dielectric layer 512 or the sensing metal material of sensing metal layer 508. Because this region 1022 may not be used for sensing during operation the CMUT (e.g., as described in connection with FIGS. 4A, 4B, and 4C and in contrast with the middle or outer regions of the cavity bottom layer), it may simplify fabrication to remove or not form the sensing metal layer 508 and/or the dielectric layer 512 in region 1022. Additionally, forming region 1022 of only the material of layer 520 and not including the dielectric material of dielectric layer 512 may reduce surface charging on the pedestals 517a within this region 1022.

Figure 11:
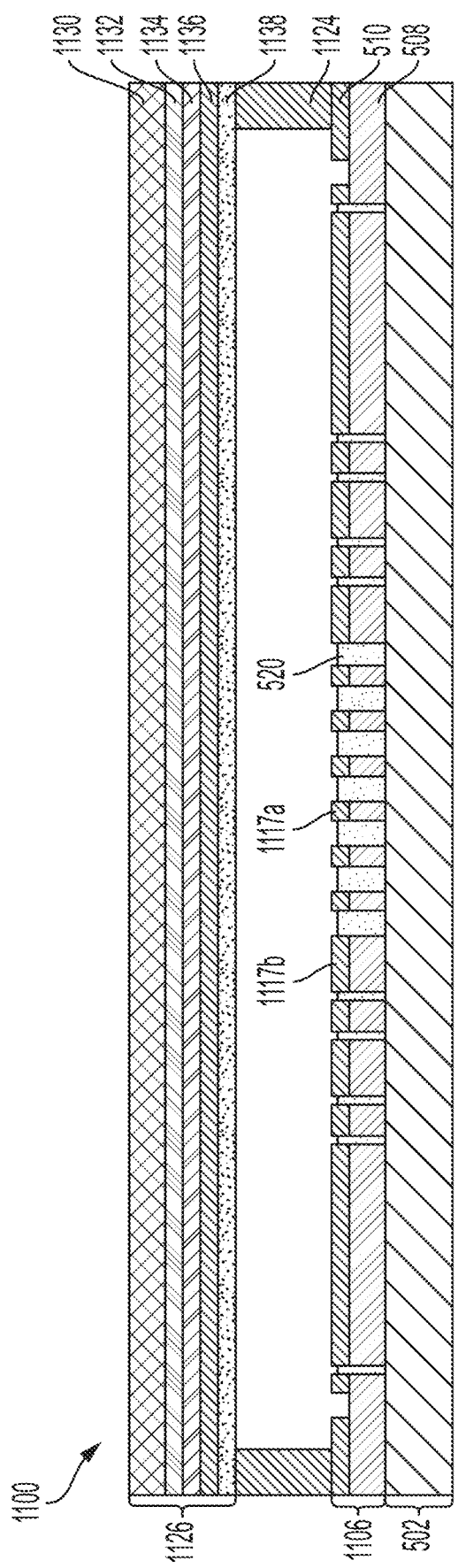
FIG. 11 illustrates a cross-sectional view of another CMUT including a high K dielectric disposed on the CMUT membrane, in accordance with certain embodiments of the present disclosure.

FIG. 11 illustrates a cross-sectional view of a CMUT 1100, in accordance with certain embodiments of the present disclosure. In the example of FIG. 11, the cavity bottom layer 1106 is formed on substrate 502 and includes a sensing metal layer 508 and the oxide layer 510, as described in connection with FIG. 5A herein. The cavity bottom layer 1106 does not include a dielectric layer (e.g., dielectric layer 512). The pedestals 1117a, 1117b are formed only by etching the sensing metal layer 508 and the oxide layer 510. An insulating layer 520 is deposited, as described in connection with FIG. 5G to fill the trenches between pedestals 1117a, 1117b and the sensing metal layer 508 and to provide electrical isolation of the pedestals 1117a, 1117b.

The membrane 1126 includes a silicon base layer 1130. The silicon base layer 1130 may be, in some embodiments, originally a silicon wafer (e.g., a handling wafer) upon which the layers 1132, 1134, 1136, and 1138 are deposited. Once the membrane 1126 is bonded to the cavity bottom layer 1106 and side walls 1124, the bulk of the silicon wafer may be removed (e.g., by chemical or other polishing) to thin the membrane 1126.

The layers 1132, 1134, 1136, and 1138 include an oxide layer 1132, a dielectric layer 1134, an insulating layer 1136, and a passivation layer 1138. The oxide layer 1132 may be deposited to improve adhesion and/or thin film qualities (e.g., surface roughness) of the dielectric layer 1134. For example, the oxide layer 1132 may be a thermal oxide (e.g., silicon dioxide) and may be formed using thermal annealing and/or chemical vapor deposition.

The benefits of a high-K dielectric layer, including for example improved operation and/or device reliability as described herein, are achieved in CMUT 1100 by including a dielectric layer 1134 in the structure of membrane 1126. In some embodiments, the dielectric layer 1134 may be deposited on top of the seed oxide layer 1132. The dielectric layer 1134 may be formed of a dielectric material having a large dielectric constant (e.g., greater than 3.9, in a range from 3.9 to 50, greater than 6, in a range from 6 to 50), as described in connection with dielectric layer 512. For example, the dielectric layer 1134 may be one of $SiO_2$, $Si_3N_4$, $HfO_2$, $SrRuO_3$ and/or $BaTiO_3$. The dielectric layer 1134 may be deposited using a physical vapor deposition technique (e.g., sputtering, evaporation).

The insulating layer 1136 and the optional passivation layer 1138 may be included in the membrane 1126 to protect the dielectric layer 1134. For example, the insulating layer 1136 and optional passivation layer 1138 may protect the dielectric layer 1134 from mechanical damage caused during operation of the CMUT 1100 in collapse mode. The insulating layer 1136 may be, for example, silicon dioxide, and may be formed using, for example, chemical vapor deposition. The optional passivation layer 1138 may be, for example, sapphire ($Al_2O_3$), and may be formed using, for example, atomic layer deposition.

Figure 12:
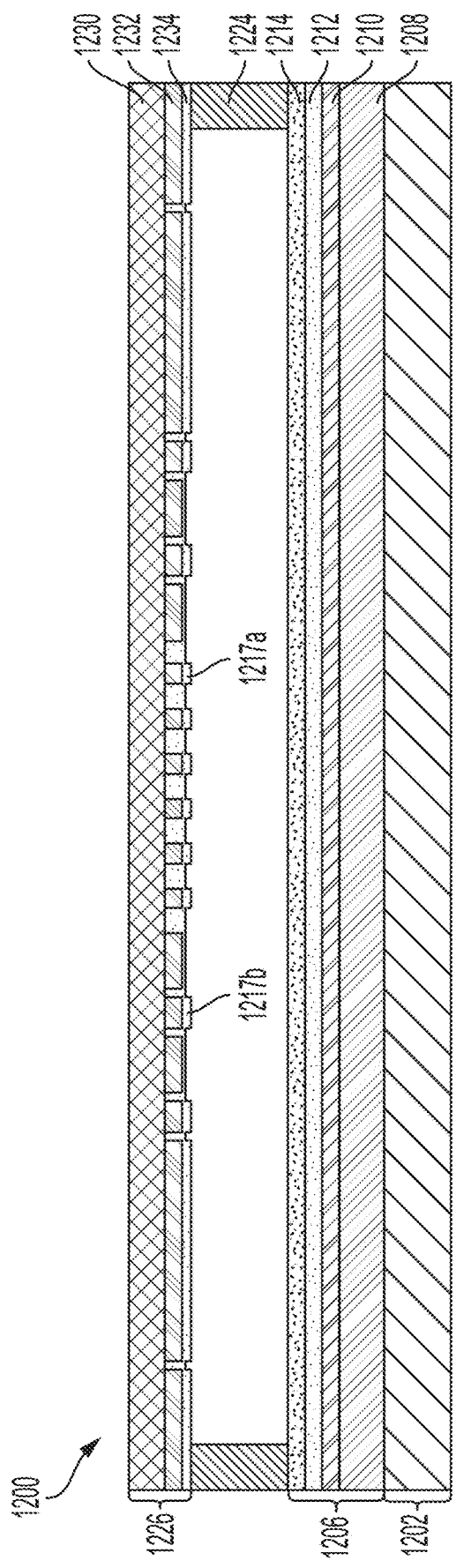
FIG. 12 illustrates a cross-sectional view of another CMUT including pedestals disposed on the CMUT membrane, in accordance with certain embodiments of the present disclosure.

FIG. 12 illustrates a cross-sectional view of a CMUT 1200, in accordance with certain embodiments of the present disclosure. CMUT 1200 includes a "reversed" arrangement having a cavity bottom layer 1206 with a flat surface and a membrane 1226 including pedestals 1217a, 1217b. The cavity bottom layer 1206 includes a sensing metal layer 1208, a dielectric layer 1210, an insulating layer 1212, and optionally, a passivation layer 1214. The sensing metal layer 1208 may be formed as described in connection with sensing metal layer 508 herein and may include Ti and TiN layers. The dielectric layer 1210 may be formed of a high-K dielectric material (e.g., having a dielectric constant greater than 3.9, in a range from 3.9 to 50, greater than 6, in a range from 6 to 50) as described in connection with dielectric layer 512 herein. The insulating layer 1212 may be, for example, formed of silicon dioxide as described in connection with layer 514 herein. The optional passivation layer 1214 may be, for example, formed of sapphire ($Al_2O_3$) as described in connection with passivation layer 730 herein.

The membrane 1226 includes a silicon base layer 1230, a first oxide layer 1232, and an insulating layer 1234. As described in connection with FIG. 11, the silicon base layer 1230 may be, in some embodiments, originally a silicon wafer (e.g., a handling wafer) upon which the layers 1232 and 1234 are deposited. Once the membrane 1226 is bonded to the cavity bottom layer 1206 and side walls 1224, the bulk of the silicon wafer may be removed (e.g., by chemical or other polishing) to thin the membrane 1226.

The first oxide layer 1232 may be patterned to form the base structures of the pedestals 1217a, 1217b. For example, the oxide layer 1232 may be deposited on the silicon base layer 1230, for example, using physical or chemical vapor deposition techniques and thereafter etched (e.g., using a dry etch such as, for example, RIE or DRIE) to form trenches defining pedestals 1217a, 1217b. In some embodiments, the first oxide layer 1232 may be formed of an oxide such as, for example, a thermal oxide (e.g., silicon dioxide).

The insulating layer 1234 is deposited on top of the first oxide layer 1232. For example, the insulating layer 1234 may be deposited to fill in the trenches defining the pedestals 1217a, 1217b and to provide a protective layer over the first oxide layer 1232. The insulating layer 1234 may be formed of, for example, silicon dioxide using a chemical vapor deposition technique.

Figure 13:
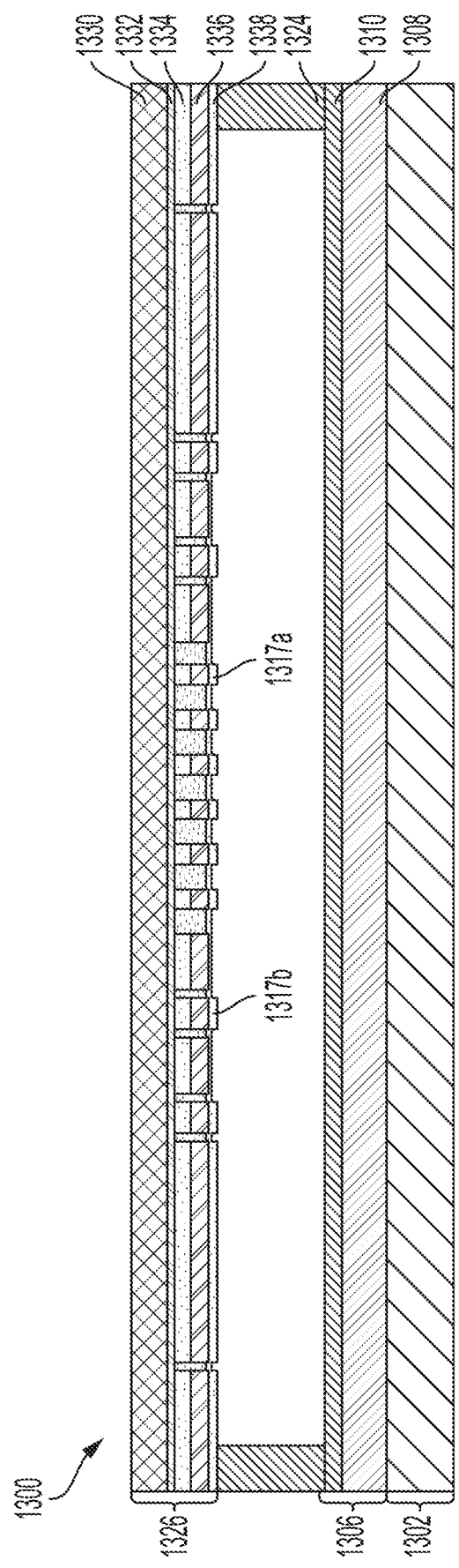
FIG. 13 illustrates a cross-sectional view of another CMUT including electrically isolated pedestals disposed on the CMUT membrane, in accordance with certain embodiments of the present disclosure.

FIG. 13 illustrates a cross-sectional view of a CMUT 1300, in accordance with certain embodiments of the present disclosure. CMUT 1300 includes an arrangement having a cavity bottom layer 1306 with a flat surface and a membrane 1326 including pedestals 1317a, 1317b. The cavity bottom layer 1306 includes a sensing metal layer 1308 and an insulating layer 1310. The sensing metal layer 1308 may be formed as described in connection with sensing metal layer 508 herein and may include Ti and TiN layers. The insulating layer 1212 may be, for example, formed of silicon dioxide as described in connection with layer 514 herein.

The membrane 1326 includes a silicon base layer 1330, a first oxide layer 1332, a second oxide layer 1334, a dielectric layer 1336, and a passivation layer 1338. As described in connection with FIGS. 11 and 12, the silicon base layer 1330 may be, in some embodiments, originally a silicon wafer (e.g., a handling wafer) upon which the layers 1332-1338 are deposited. Once the membrane 1326 is bonded to the cavity bottom layer 1306 and side walls 1324, the bulk of the silicon wafer may be removed (e.g., by chemical or other polishing) to thin the membrane 1326.

The first oxide layer 1332 may be deposited as a seed layer to improve adhesion and/or thin film qualities (e.g., surface roughness) of the dielectric layer 1336. For example, the seed oxide layer 1332 may be a thermal oxide (e.g., silicon dioxide) and may be formed using thermal annealing and/or chemical vapor deposition techniques.

The second oxide layer 1334 may then be deposited to cover the first oxide layer 1332 and to act as a base of the pedestals 1317a, 1317b. The second oxide layer 1334 may be formed of, for example, silicon dioxide. The second oxide layer 1334 may be formed using, for example, chemical vapor deposition techniques.

The benefits of a high-K dielectric layer including improved operation and/or device reliability as described herein, are achieved in CMUT 1300 by including a dielectric layer 1336 in the structure of membrane 1326. The dielectric layer 1336 may be deposited on top of the first oxide layer 1332 and the second oxide layer 1334. The dielectric layer 1336 may be formed of a dielectric material having a large dielectric constant (e.g., greater than 3.9, in a range from 3.9 to 50, greater than 6, in a range from 6 to 50), as described in connection with dielectric layer 512. For example, the dielectric layer 1336 may be one of $SiO_2$, $Si_3N_4$, $HfO_2$, $SrRuO_3$ and/or $BaTiO_3$. The dielectric layer 1336 may be deposited using a physical vapor deposition technique (e.g., sputtering, evaporation).

After formation of the dielectric layer 1336, trenches may be formed to define the structures of the pedestals 1317a, 1317b. For example, the trenches may be formed using a dry etch technique (e.g., RIE, DRIE) as described in connection with FIGS. 5D-5E herein. The trenches may be filled with an insulating material (e.g., silicon dioxide).

The passivation layer 1338 may be included in the membrane 1326 to protect the dielectric layer 1336 (e.g., from mechanical damage caused during operation of the CMUT 1300 in collapse mode). The passivation layer 1338 may be, for example, sapphire ($Al_2O_3$), and may be formed using, for example, atomic layer deposition.

In some embodiments, the CMUTs described herein (e.g., CMUT 300, 500, 700, 800, 900, 1000, 1100, 1200, and/or 1300) may be integrated into an ultrasound device. For example, the CMUTs may be arranged to form an array. In some embodiments, the CMUTs form a 2D array, although in alternative embodiments the CMUTs may form a 1.5D array or a 1D array. The array includes hundreds or thousands of CMUTs in some embodiments. For example, the ultrasound device in some embodiments includes an array of between 7,000 and 12,000 (e.g., 9,000) ultrasonic transducers arranged in a 2D array. Other numbers of ultrasonic transducers may be implemented in alternative embodiments.

In some embodiments, the CMUTs described herein (e.g., CMUT 300, 500, 700, 800, 900, 1000, 1100, 1200, and/or 1300) may be integrated into a point-of-care ultrasound device. For example, the ultrasound device may be a handheld ultrasound probe or a patch. Additional aspects of a handheld ultrasound device are described in U.S. Patent Application Publication No.: 2017/0360399 titled "Universal Ultrasound Device and Related Apparatus and Methods," filed on Jun. 19, 2017, which is incorporated herein by reference in its entirety.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, reference to a numerical value being between two endpoints should be understood to encompass the situation in which the numerical value can assume either of the endpoints. For example, stating that a characteristic has a value between A and B, or between approximately A and B, should be understood to mean that the indicated range is inclusive of the endpoints A and B unless otherwise noted.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:

1. An ultrasound device, comprising:
a substrate;
a cavity bottom layer disposed on the substrate, the cavity bottom layer comprising:
an inner region having a first radius, the inner region comprising a first plurality of pedestals protruding from a surface of the cavity bottom layer, wherein pedestals of the first plurality of pedestals comprise a first pedestal radius;
a middle region having a first inner radius and a first outer radius, the first inner radius being approximately equal to the first radius and the first outer radius being greater than the first inner radius, the middle region comprising a second plurality of pedestals protruding from the surface of the cavity bottom layer, wherein pedestals of the second plurality of pedestals comprise a second pedestal radius greater than the first pedestal radius;
an outer region surrounding the middle region and having a second inner radius and a second outer radius, the second inner radius being approximately equal to the first outer radius and the second outer radius being greater than the second inner radius; and
an electrode layer disposed under the middle region and the outer region; and
side walls extending from the cavity bottom layer; and
a membrane disposed opposite the substrate and supported by the side walls to form a sealed cavity between the membrane and the substrate,
wherein the pedestals of the first plurality of pedestals and the pedestals of the second plurality of pedestals are electrically isolated from the electrode layer.

2. The ultrasound device of claim 1, wherein the pedestals of the first plurality of pedestals and the pedestals of the second plurality of pedestals comprise a dielectric material having a dielectric constant in range from 3.9 to 50.

3. The ultrasound device of claim 2, wherein the dielectric material comprises silicon dioxide (SiO2), silicon nitride (SiJN4), or hafnium oxide (HfO2).

4. The ultrasound device of claim 1, wherein the pedestals of the first plurality of pedestals and the pedestals of the second plurality of pedestals are electrically isolated from the electrode layer by a trench.

5. The ultrasound device of claim 4, wherein the trench comprises an electrically insulating material having a resistivity in a range from $1\times10^{15}$ Q-m to $1\times10^{25}$ Q-m.

6. The ultrasound device of claim 1, wherein pedestals of the first plurality of pedestals have a first pitch and pedestals of the second plurality of pedestals have a second pitch greater than the first pitch.

7. The ultrasound device of claim 1, wherein the electrode layer comprises a plurality of layers including a titanium nitride (TiN) layer and a titanium (Ti) layer.

* * * * *